United States Patent

Sotokawa et al.

[11] Patent Number: 5,868,949
[45] Date of Patent: Feb. 9, 1999

[54] METALIZATION STRUCTURE AND MANUFACTURING METHOD THEREOF

[75] Inventors: Hideo Sotokawa, Yokohama; Masashi Nishiki, Fujisawa; Eiji Matsuzaki, Yokohama; Hidetaka Shigi, Hakone-machi; Toshio Terouchi, Hadano; Mamoru Ogihara, Yamakitamachi kishi; Haruhiko Matsuyama, Hiratsuka; Minoru Tanaka, Kanagawa-ken, all of Japan

[73] Assignee: Hitachi, Ltd., Tokyo, Japan

[21] Appl. No.: 557,320

[22] Filed: Nov. 14, 1995

[30] Foreign Application Priority Data

Nov. 14, 1994 [JP] Japan ..................... 6-279345

[51] Int. Cl.⁶ ..................................... B44C 1/22
[52] U.S. Cl. ................. 216/18; 216/20; 428/209
[58] Field of Search ................... 216/13, 17, 18, 216/19, 20, 39, 56; 29/852; 428/209, 901, 473.5; 427/97

[56] References Cited

U.S. PATENT DOCUMENTS

| 5,118,385 | 6/1992 | Kumar et al. ............... 216/18 |
| 5,209,817 | 5/1993 | Ahmad et al. .............. 216/18 |

*Primary Examiner*—William Powell
*Attorney, Agent, or Firm*—Antonelli, Terry, Stout & Kraus, LLP

[57] ABSTRACT

A metalization structure having a first conductor layer on the surface of an underlying layer and, further, a second conductor layer connected conductively with the first conductor layer in which a polyimide insulative film of low thermal expansion coefficient is present between at least an end of a pattern of the second conductor layer and the first conductor layer, for stably obtaining a metalization structure of high reliability and free from the worry of peeling of the conductor portion from a substrate or occurrence of cracking to the underlying layer.

36 Claims, 8 Drawing Sheets

METALIZATION STRUCTURE AND MANUFACTURING METHOD THEREOF

BACKGROUND OF THE INVENTION

1. Field of the Invention

The present invention concerns a metalization structure and, more in particular, it relates to a metalization structure suitable to a case of using a conductor layer of a conductive material comprising nickel as a main ingredient, as well as a manufacturing method thereof.

2. Description of the Related Art

In recent years, as development has been made for increasing the number of layers, increasing the degree of integration and improving the performance of wiring substrates for mounting LSI, higher characteristics have been demanded for insulative films used therefor. As one of such insulative films, polyimides have been used generally at present in view of their excellent thermal and chemical stability.

For mounting a wiring substrate such as a multichip module and electronic parts such as LSI by way of soldering connection, connecting electrodes are disposed to the wiring substrate. In this case, nickel or nickel-based alloy is desirably used for the outermost layer of the electrode (layer in direct contact with solder). This is because of facilitating repair of the soldering connection.

In view of the above, as a method of forming an electrode for soldering connection, there may be considered, as shown in FIG. 6, a method of providing an aligning pad 63 comprising three Cr/Cu/Cr layers on the surface of a wiring substrate 62 having copper wirings 61, forming an Ni—W alloy electrode 64 on the surface, insulating the same by covering with a polyimide film 65 and forming through holes 66 to the polyimide film. In this method, the entire surface of the electrode 64 facing the aligning pad 63 is in an intimate contact with the surface of the aligning pad 63 to obtain a metalization structure in which ends of the aligning pad 63 and the electrode 64 are covered with the polyimide insulative film 65.

This method has a merit capable of collectively making film formation and fabrication for the aligning pad and the electrode respectively.

When the electrode 64 is formed in this method, it is necessary to etch the Ni—W alloy film into a shape of the electrode with phosphoric acid+nitric acid+acetic acid system. However, since the etching solution also etches Cr and Cu, it involves a problem that the aligning pad 63 in the lower layer is eroded from the end upon etching of the electrode 64.

Further, since the film stress of Ni—W is large, when the electrode 64 is formed by etching, there is a problem that the conductor portion (the electrode 64 and the aligning pad 63) is cleaved or peeled from the substrate or the substrate suffers from cracking or chipping by the film stress. That is, when a pattern of a conductor mainly composed of a copper is formed on the underlying layer such as a glass substrate, ceramic substrate or polyimide film and a conductor pattern comprising nickel as a main ingredient is formed on the above-mentioned pattern, a strong stress is caused between the conductor comprising copper as a main ingredient and the conductor comprising nickel as a main ingredient to cause cracking or chipping in the underlying layer. The cracking or chipping hinders electric connection of internal conductors in the underlying layer or causes peeling of the conductor comprising nickel as a main ingredient from the underlying layer to remarkably deteriorate the reliability of the metalization structure.

SUMMARY OF THE INVENTION

It is an object of the present invention to provide a metalization substrate free from the worry of peeling of the conductor portion from the substrate or generation of cracking in the underlying layer upon etching of an electrode, as well as a production or manufacturing method therefor.

The foregoing object can be attained in accordance with the present invention by a metalization structure comprising a conductor layer and a polyimide-containing insulative layer, and further comprising a conductor layer made of a conductor material on the surface of the insulative layer, wherein the polyimide layer as the underlying layer for the conductor layer contains the following polyimide A or B.

A: A polyimide obtained by polymerizing:

a tetracarboxylic acid dianhydride represented by the following general formula (15):

where R1 represents at least one tetravalent organic group selected from the following structural formula (2)

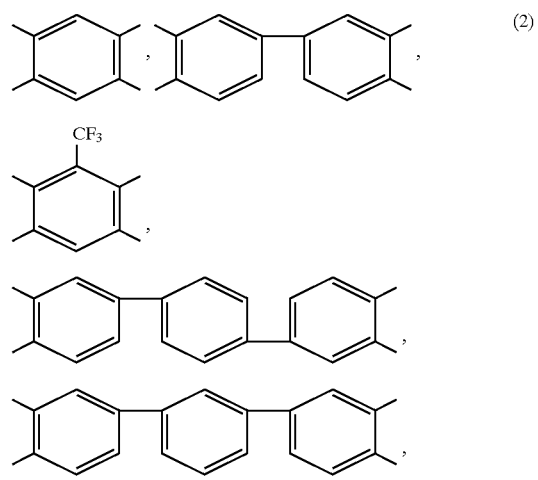

and a diamine compound represented by the following general formula (16):

where R2 is at least one bivalent organic group selected from the following structural formulae (3):

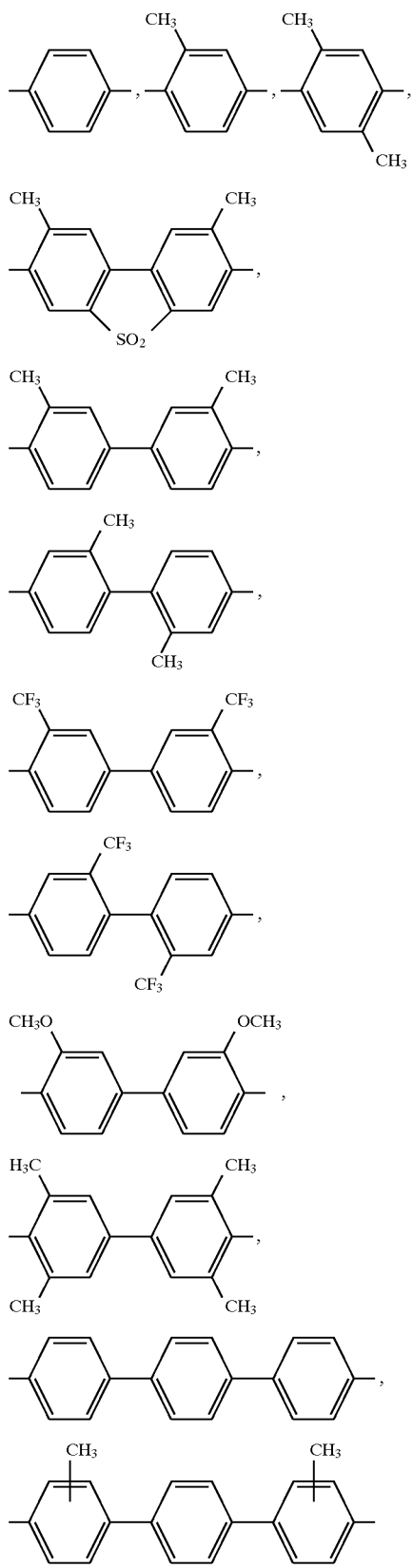

Among the polyimides, the following polyimide (a) or (b) is preferred.

(a): A polyimide obtained by polymerizing:

a tetracarboxylic acid dianhydride represented by the following general formula (21):

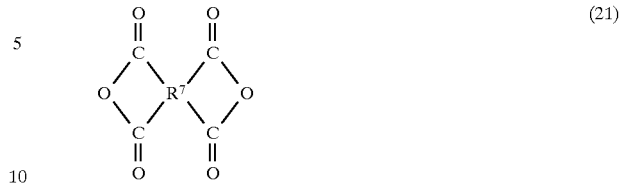

where R7 is at least one tetravalent organic group selected from the following structural formulae (12):

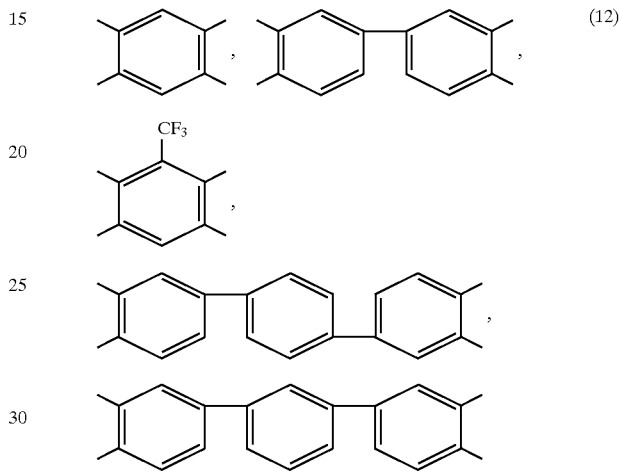

and a diamine compound represented by the general formula (23):

where R9 is at least one bivalent organic group selected from the following structural formulae (14):

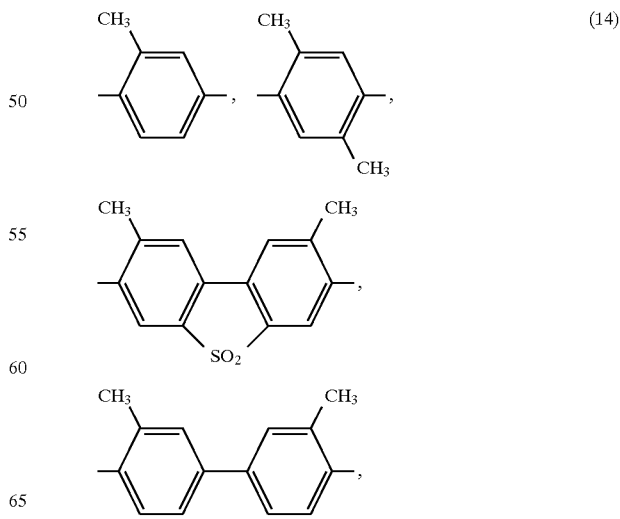

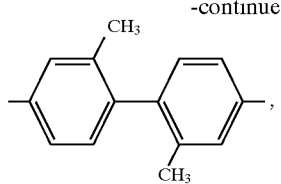

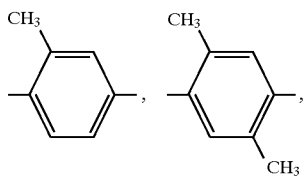

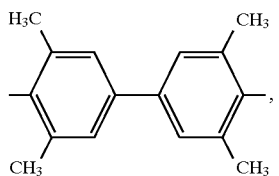

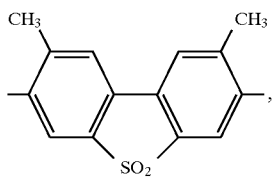

(14)

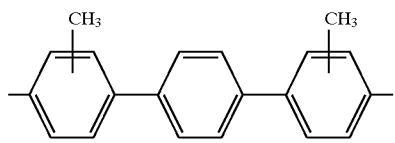

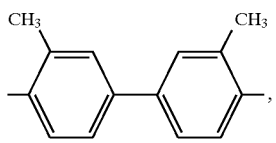

(b): A polyimide obtained by polymerizing the tetracarboxylic acid dianhydride represented by the general formula (21) described above and a diamine compound including:
based on 100 mol of the entire amount,
0 to 95 (excluding 0) mol of a diamine compound represented by the following general formula (22):

$$H_2N-R^8-NH_2 \quad (22)$$

where R8 is at least one bivalent organic group selected from the following structural formulae (13):

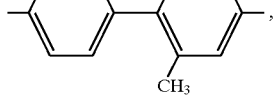

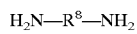 (13)

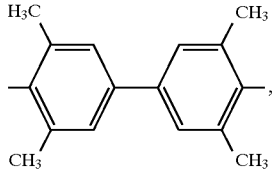

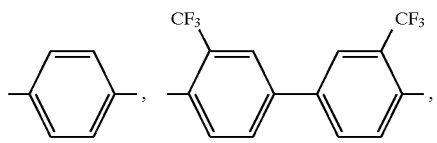

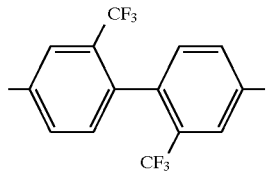

B: A polyimide obtained by heat-curing a polyimide precursor obtained by polymerizing:
based on the entire amount of 100 mol of the tetracarboxylic acid dianhydride,
60 to 100 mol of a tetracarboxylic acid dianhydride represented by the following general formula (17):

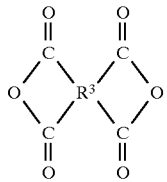 (17)

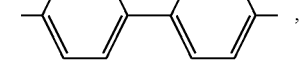

and
5 to 100 mol of a diamine compound represented by the following general formula (23):

$$H_2N-R^9-NH_2 \quad (23)$$

where R9 is at least one bivalent organic group selected from the following structural formulae (14):

wherein R3 represents at least one tetravalent organic group selected from the following structural formulae (6):

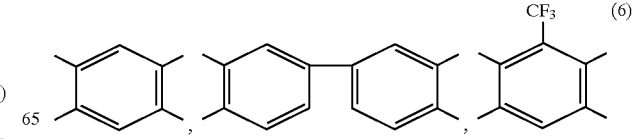 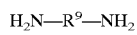 (6)

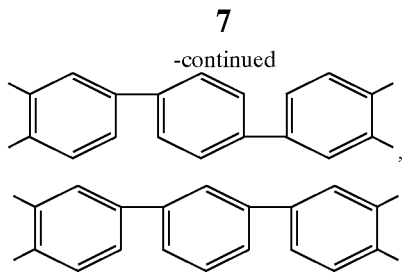

0 to 40 (excluding 0) mol of a tetracarboxylic acid dianhydride represented by the following general formula (18):

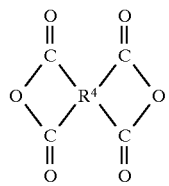
(18)

where R4 is at least one tetravalent organic group selected from the following structural formulae (7):

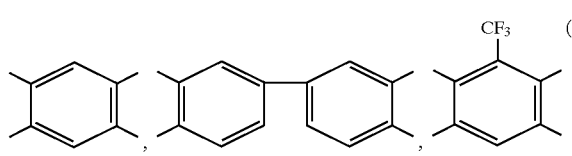
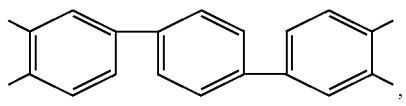
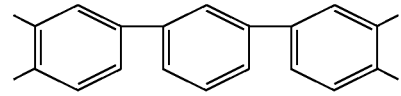
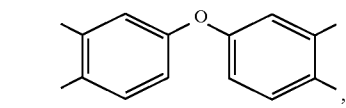
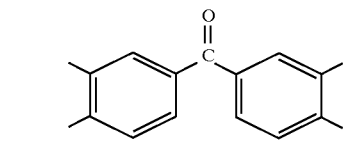
(7)

60 to 100 mol of a diamine compound represented by the following general formula (19):

$H_2N-R^5-NH_2$ (19)

where R5 is at least one bivalent organic group selected from the following structural formulae (8):

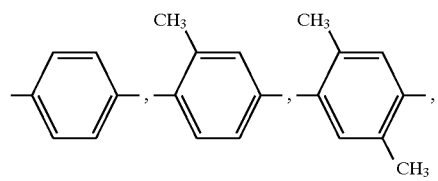
(8)

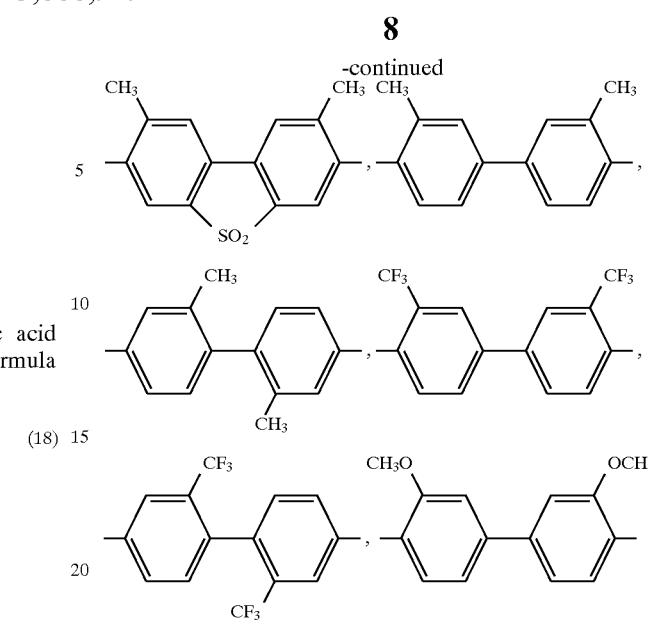

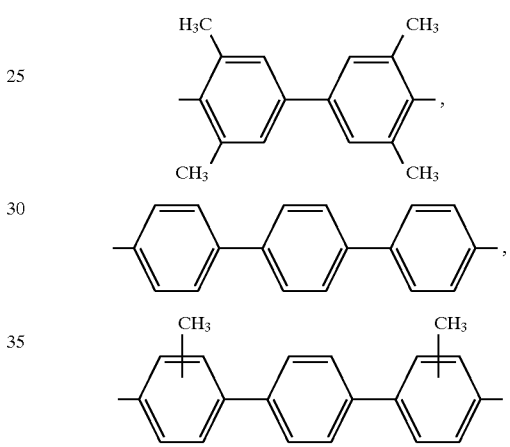

and 0 to 40 (excluding 0) mol of a diamine compound represented by the following general formula (20):

$H_2N-R^6-NH_2$ (20)

where R6 is at least one bivalent organic group selected from the following structural formulae (9):

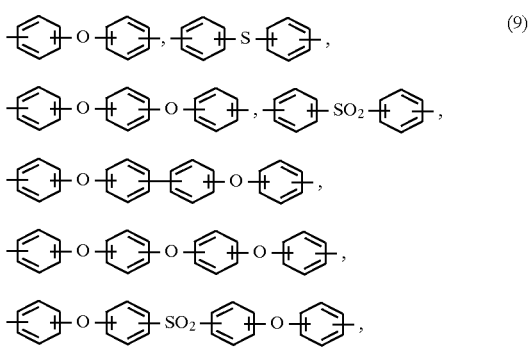
(9)

-continued

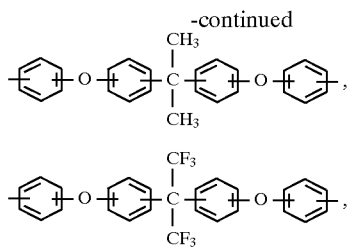

Further, the conductor layer on the surface of the insulative film containing such polyimide preferably has at least a layer comprising a nickel-containing conductor material. The conductor layer comprises, further preferably, a layer comprising chromium, titanium, molybdenum or tungsten and a layer comprising a nickel-containing conductor material. Further, the thickness of the conductor layer or the thickness of the layer comprising nickel-containing conductor material is preferably not more than 3.0 μm.

Further, the present invention provides a metalization structure comprising a first conductor layer on the surface of an underlying layer and, further, a second conductor layer connected in conduction with the first conductor layer, wherein a structure in which a polyimide insulative film is present between at least an end of a second conductor layer pattern and a first conductor, is provided to at least a portion.

It is desirable that the second conductor layer is partially laminated directly to the surface of the first conductor layer, or the first conductor layer and the second conductor layer are connected by way of a third conductor layer because this can easily ensure conduction.

It is preferred that the first conductor layer has at least a layer comprising a copper-containing first conductor material, and the second conductor layer has at least a layer comprising a nickel-containing second conductor material. The first conductor layer further preferably has a layer comprising chromium, titanium, molybdenum or tungsten, a layer comprising the first conductor material and a layer comprising chromium, titanium, molybdenum or tungsten in this order. The second conductor layer has further preferably a layer comprising chromium, titanium, molybdenum or tungsten and a layer comprising the second conductor material. The third conductor layer is preferably a layer comprising a copper-containing conductor material. The thickness of the second conductor layer or the layer comprising the second conductor material is preferably not more than 3.0 μm.

The polyimide insulative film between at least the end of the second conductor layer pattern and the first conductor layer preferably contains the polyimide A or B described above.

Further, the present invention provides the following (1) and (2) as a process for manufacturing the metalization structure.

(1) A method of manufacturing a metalization structure comprising: a first conductor forming step of forming a conductor pattern of a first conductor layer on the surface of an underlying layer; and insulative film forming step of forming a polyimide insulative film having a through hole at a position for exposing at least a portion of the conductor pattern of the first conductor layer; and a second conductor forming step of forming a conductor pattern of a second conductor layer so as to cover the exposed conductor pattern of the first conductor layer and the periphery for the opening of the through holes of the polyimide insulative film.

(2) A method of manufacturing a metalization structure comprising: a first conductor layer step of forming a conductor pattern of a first conductor layer on the surface of an underlying layer; an insulative film forming step of forming a polyimide insulative film having a through hole at a position for exposing at least a portion of the conductor pattern of the first conductor layer; a via wiring forming step of forming via wirings by filling a conductor to the through holes; and a second conductor layer forming step of forming a conductor pattern of a second conductor layer so as to cover the exposed surface of the conductor constituting the via wirings filled to the conductor and the periphery of the exposed surface.

The first conductor layer forming step preferably has at least a step of forming a layer comprising a copper-containing first conductor material and, further preferably, comprises a step of forming a layer comprising chromium, titanium, molybdenum or tungsten and a step of forming a layer comprising a first conductor material and a step of forming a layer comprising chromium, titanium, molybdenum or tungsten in this order.

The second conductor layer forming step preferably has at least a step of forming a layer comprising a nickel-containing second conductor material and, further preferably, has a step of forming a layer comprising chromium, titanium, molybdenum or tungsten and a step of forming a layer comprising a second conductor material. The thickness of the layer comprising the second conductor material formed in the second conductor layer forming step is preferably not more than 3.0 μm, and the thickness of the second conductor layer itself is preferably not more than 3.0 μm.

In a case of providing a via wiring forming step, the conductor material filled in the through holes preferably contains copper.

The insulative film forming step preferably contains a step of obtaining polyimide by heat-curing a polyimide precursor obtained by polymerizing:

a tetracarboxylic acid dianhydride represented by the following general formula (15):

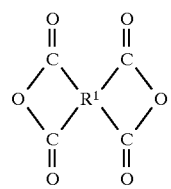

(15)

where R1 is at least one tetravalent organic group selected from the following structural formulae (2):

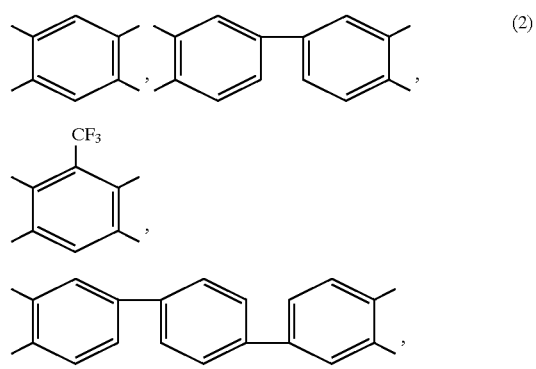

(2)

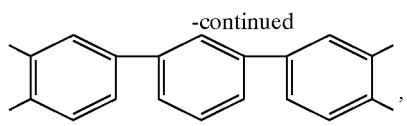

and a diamine compound represented by the following general formula (16):

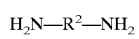 (16)

where R2 is at least one bivalent organic group selected from the following structural formulae (3):

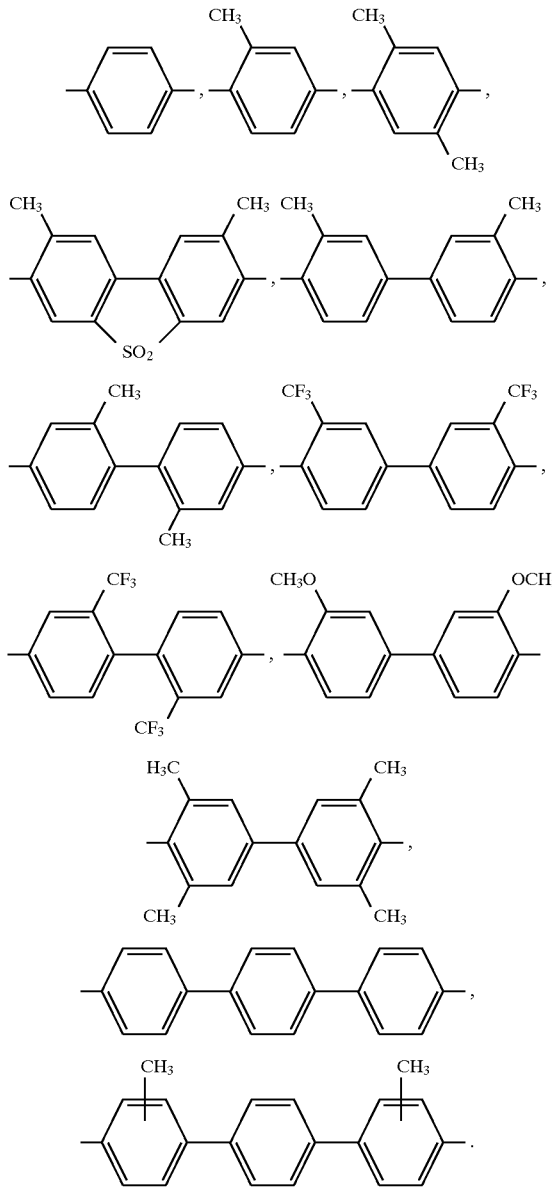 (3)

It is further preferred to use, as the tetracarboxylic acid dianhydride represented by the general formula (15) described above, a tetracarboxylic acid dianhydride represented by the following general formula (21):

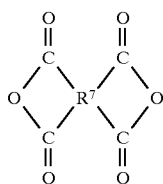 (21)

where R7 is at least one tetravalent organic group selected from the following structural formulae (12):

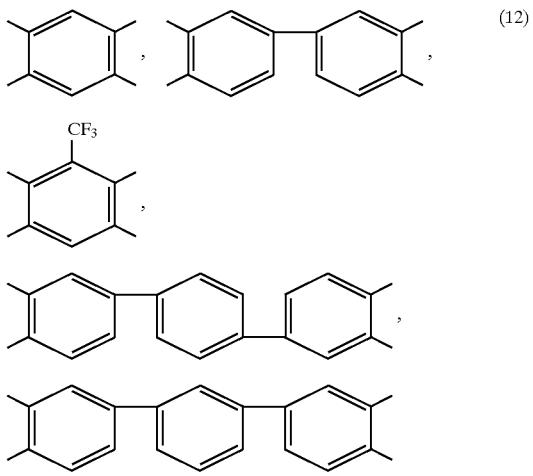 (12)

as the diamine compound represented by the general formula (16) described above, a diamine compound represented by the following general formula (23):

 (23)

where R9 is at least one bivalent organic group selected from the following structural formulae (14):

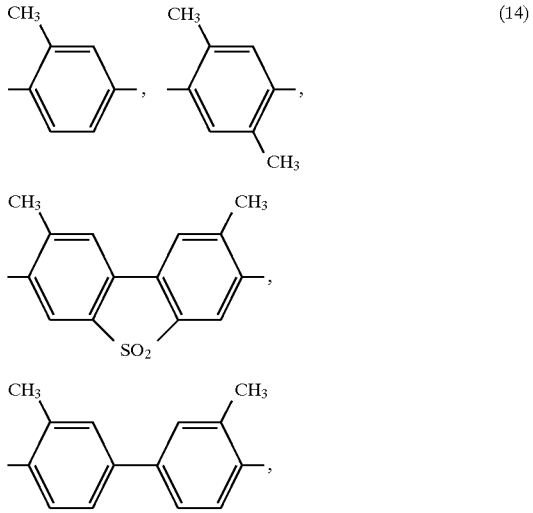 (14)

-continued

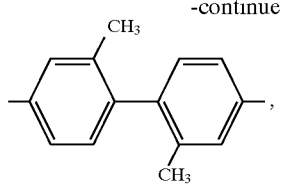

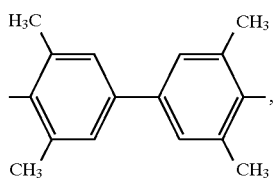

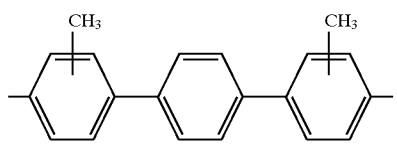

or as the tetracarboxylic acid dianhydride represented by the general formula (15) described above, a tetracarboxylic acid dianhydride represented by the general formula (21) described above, and to use:

as the diamine compound represented by the general formula (16) described above, based on 100 mol of the entire amount of the diamine compound, 0 to 95 (excluding 0) mol of a diamine compound represented by the following general formula (22)

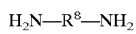 (22)

where R8 is at least one bivalent organic group selected from the following structural formulae (13):

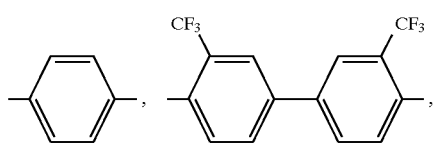 (13)

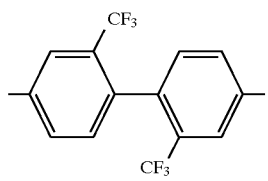

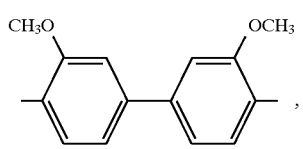

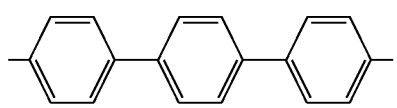

and 5 to 100 mol of a diamine compound represented by the general formula (23):

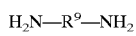 (23)

where R9 is at least one bivalent organic group selected from the following structural formulae (14):

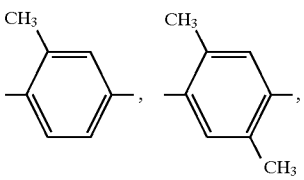 (14)

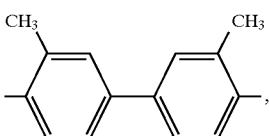

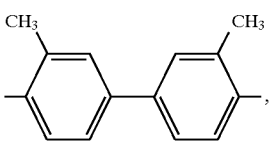

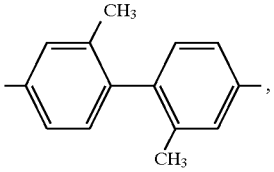

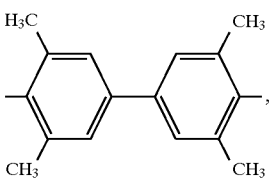

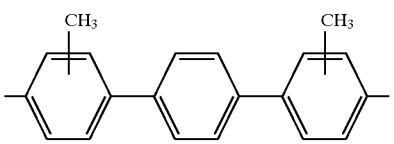

Alternatively, the insulative film forming step may include a step of obtaining a polyimide by polymerizing, based on 100 mol of the entire amount of the polyimide precursor, 60 to 100 mol of the following first polyimide precursor and 0 to 40 (excluding 0) mol of the following second polyimide precursor.

The first polyimide precursor is obtained by polymerizing:

a tetracarboxylic acid dianhydride represented by the following general formula (17):

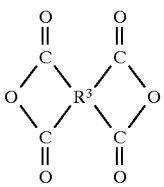 (17)

where R3 is at least one tetravalent organic group selected from the following structural formulae (6):

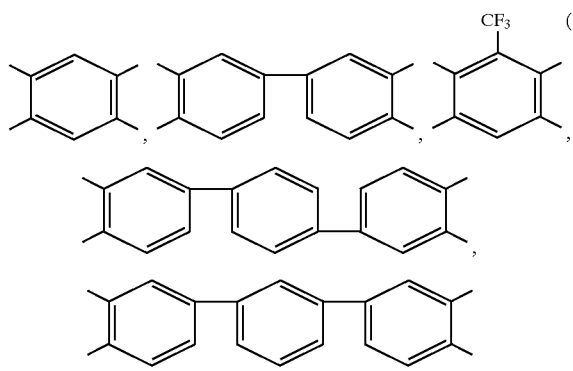

and a diamine compound represented by the following general formula (19):

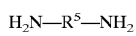

where R5 is at least one bivalent organic group selected from the following structural formulae (8):

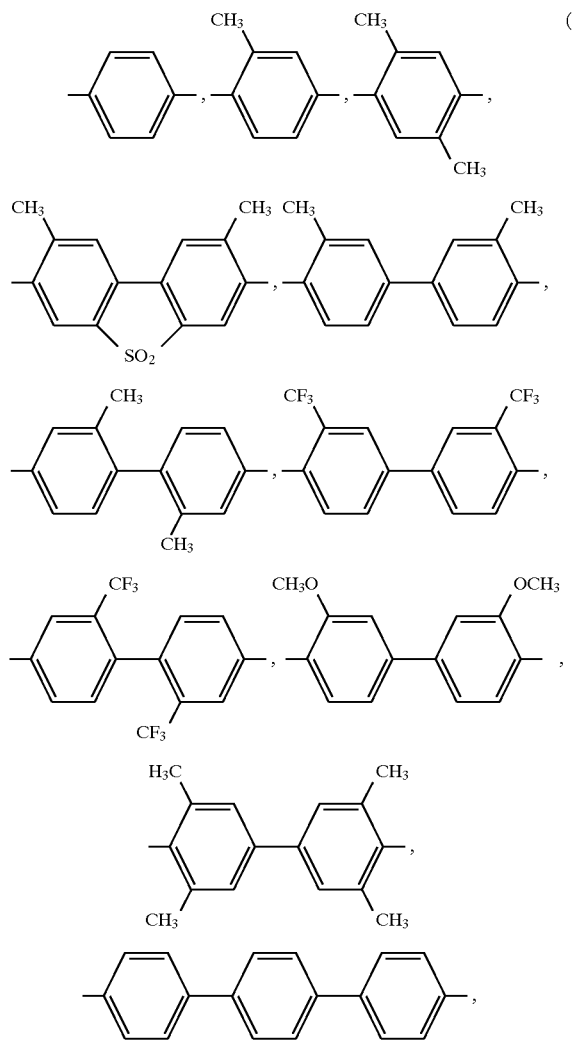

-continued

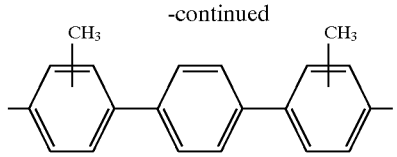

The second polyimide precursor is obtained by polymerizing:

a tetracarboxylic acid dianhydride represented by the following general formula (18):

where R4 is at least one tetravalent organic group selected from the following structural formulae (7):

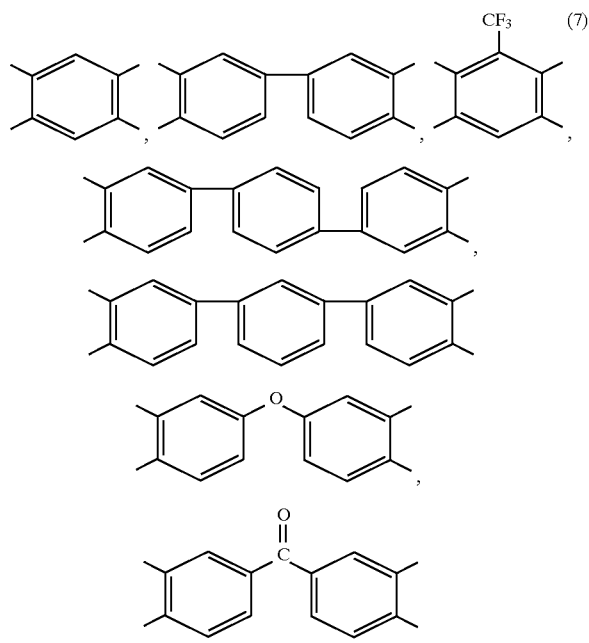

and a diamine compound represented by the following general formula (20):

where R6 is at one least bivalent organic group selected from the following structural formulae (9):

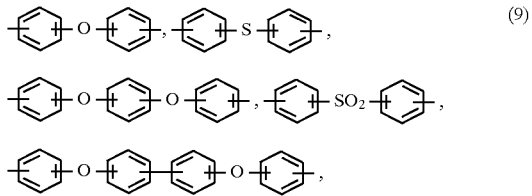

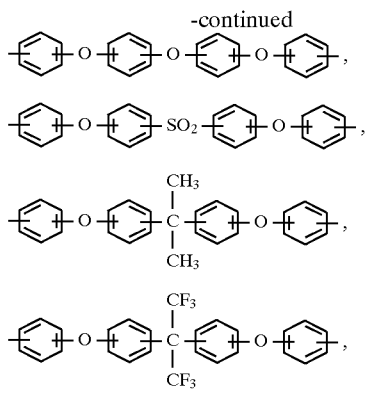

Further, the insulative film forming step preferably has: a varnish coating step of coating a polyimide precursor varnish on the surface of an underlying layer having a first conductor layer and then applying prebaking to form a polyimide precursor layer; a through hole forming step of forming a through hole to a portion of the polyimide precursor at a location of at least partially exposing the first conductor layer pattern; and a polymerizing step of heat-curing the polyimide precursor layer in this order.

The polyimide precursor varnish coated in the varnish coating step may contain a photosensitive ingredient, in which the through hole forming step may include a step of irradiating light by way of a photomask of a predetermined pattern to the polyimide precursor composition film to conduct development.

DESCRIPTION OF THE PREFERRED EMBODIMENTS

Figure 1A:
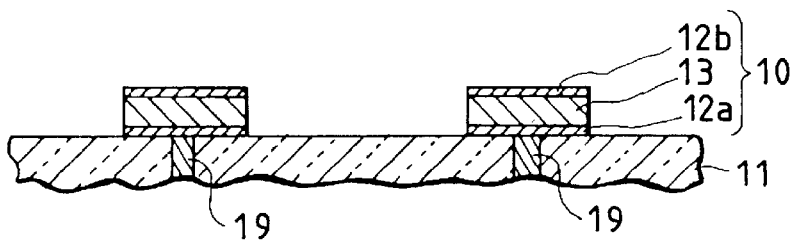
FIG. 1 is a schematic view illustrating an embodiment of a manufacturing method for a metalization structure according to the present invention.

The present invention provides a metalization structure having a first conductor layer and a second conductor layer connected in a conductive manner with the first conductor layer on an underlying layer such as a glass substrate, a ceramic substrate or a polyimide insulative film, wherein a structure in which a polyimide insulative film is present between at least an end of the second conductor layer pattern and the first conductor layer, is provided to at least a portion thereof.

The first conductor layer preferably has a layer comprising a first conductor material comprising copper as a main ingredient in view of conductivity or the like. The first conductor layer may also have a layer comprising other conductor material in addition to the layer comprising the first conductor material. For example, the first conductor layer may be a three-layered structure comprising a layer comprising a metal material such as chromium, titanium, molybdenum or tungsten, a layer comprising a first conductor material comprising copper as a main ingredient and a layer comprising a metal material such as chromium, titanium, molybdenum or tungsten in this order.

Further, the second conductor layer comprises a conductor layer of a second conductor material comprising nickel as a main ingredient. The second conductor layer may have a layer comprising other conductor material such as chromium, titanium, molybdenum or tungsten in addition to the layer comprising the second conductor material.

Further, the first conductor layer and the second conductor layer may be connected by direct lamination for a portion of the two conductor layers, or may be connected by way of a third conductor layer such as via wirings.

It has been found by the present inventors, et al that when the end of the second conductor layer is in direct contact with the first conductor layer, stresses caused by the two conductors to the underlying layer are concentrated to the end, thereby causing cracking or chipping in the underlying layer. In view of the above, in the present invention, the end of the second conductor layer is not in direct lamination with the first conductor layer as described above, but connected by way of the polyimide insulative layer because it has been found in the present invention that when at least the ends of the two conductors are separated by the polyimide insulative film such that the end of the second conductor layer is not in contact with the conductor layer comprising copper as the main ingredient, stresses are dispersed to prevent occurrence of cracking or chipping in the underlying layer.

The method of manufacturing the metalization structure according to the present invention is to be explained. Explanation is to be made in a case where the first conductor layer has three layers, i.e., a layer of a metal material such as chromium, titanium, molybdenum or tungsten, a conductor layer comprising copper as a main ingredient and a layer of a metal material such as chromium, titanium, molybdenum or tungsten in this order, and the second conductor layer has two layers, i.e., a layer comprising a metal material such as chromium, titanium, molybdenum or tungsten and a conductor layer comprising nickel as a main ingredient.

At first, explanation is to be made for a manufacturing method for the metalization structure according to the present invention in which a portion of a first conductor layer is laminated directly on the surface of a second conductor layer with reference to FIG. 1.

(a-1): As shown in FIG. 1A, a layer 12a having a predetermined pattern of a metal material such as chromium, titanium, molybdenum or tungsten is formed on one of surface or rear face of an underlying layer 11 such as a substrate or a polyimide insulative film having wirings 19, and a conductor layer 13 comprising copper as a main ingredient is laminated on the metal layer 12a. A layer 12b comprising a metal material such as chromium, titanium, molybdenum or tungsten is further laminated on the conductor layer 13 to obtain a first conductor layer 10 comprising three layers.

Figure 1B:
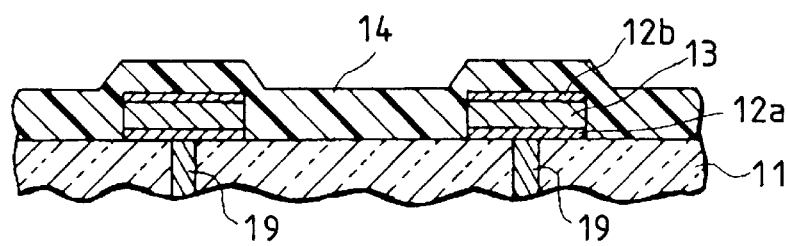
Figure 1C:
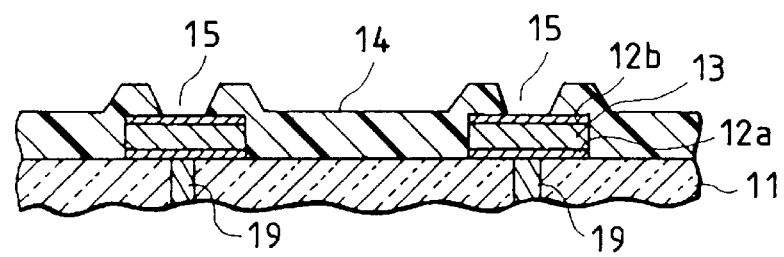
Figure 1D:
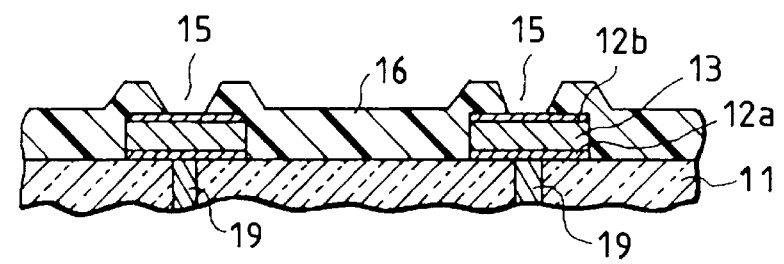

(a-2): As shown in FIG. 1B, a solution containing a polyimide precursor (polyimide precursor composition) is coated by spin-coating or the like over the entire surface of the underlying layer 11 formed with the first conductor layer 10 and then prebaked. A polyimide precursor film 14 is thus obtained.

(a-3): Then, after forming through holes at predetermined locations of the obtained polyimide precursor film 14 to form via holes 15 shown in FIG. 1C, the polyimide precursor film 14 is heat-cured by baking, to obtain a polyimide insulative film 16 shown in FIG. 1D. If the polyimide precursor composition has photosensitivity, the via hole 15 is obtained by exposure and development using a predetermined mask. If the polyimide precursor composition has no photosensitivity, the via hole 15 is obtained by forming a resist layer by using a predetermined pattern on the polyimide precursor film 14, etching the polyimide precursor film 14 by using a solution such as an organic alkali using the resist layer as a mask and then removing the resist layer. The via hole 15 may also be formed by applying baking of the polyimide precursor film 14 without perforating the through hole to heat-cure the polyimide precursor to obtain the polyimide insulative film 16 and then applying excimer laser beams or reactive ion etching using an oxygen gas.

Figure 1E:
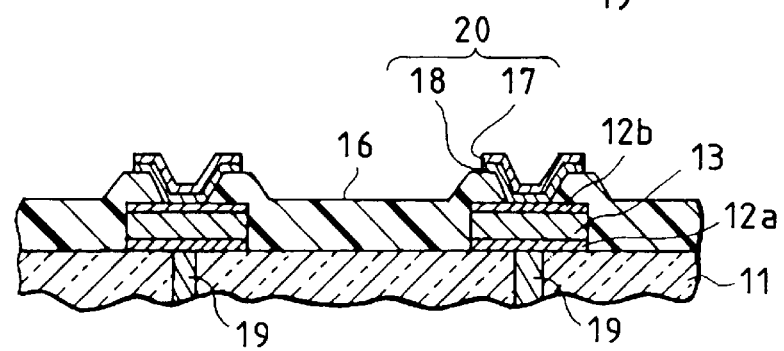

(a-4): Further, a layer 18 of a metal material such as chromium, titanium, molybdenum or tungsten and a conductor layer 17 comprising nickel as a main ingredient are formed successively, for example, by sputtering or the like to the wall surface of the obtained via hole 15, to obtain a second conductor layer 20. After forming a resist pattern on the thus obtained second conductor layer 20, the second conductor layer 20 is etched to form a pattern and the resist is removed, to obtain the second conductor layer 20 of a desired pattern as shown in FIG. 1E. Thus, a desired metalization structure is completed.

Then, explanation is to be made for a method of manufacturing a metalization structure according to the present invention, in which the first conductor layer and the second conductor layer are connected by way of a third conductor layer with reference to FIG. 2.

Figure 2A:
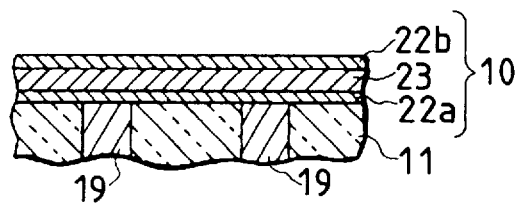
FIG. 2 is a schematic view illustrating an embodiment of a manufacturing method for a metalization structure according to the present invention.

(b-1): At first, as shown in FIG. 2A, a layer 22a of a metal material such as chromium, titanium, molybdenum or tungsten is formed on one of the surface or the rear face of an underlying layer 11 such as a substrate or a polyimide insulative film having wirings 19, and a conductor layer 23 comprising copper as a main ingredient is laminated on the metal layer 22a. Further, a layer 22b of a metal material such as chromium, titanium, molybdenum or tungsten is laminated further on the conductor layer 23 to obtain a first conductor layer 10 comprising three layers.

Figure 2B:
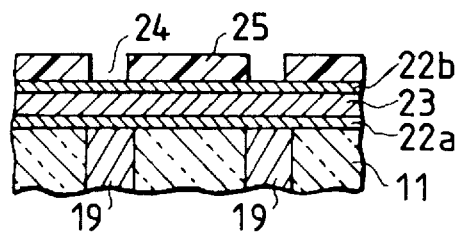
Figure 2C:
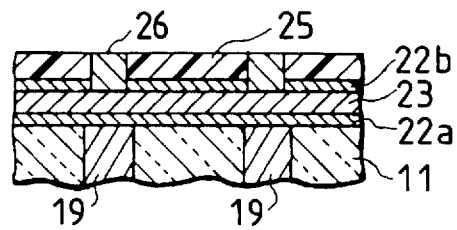

(b-2): As shown in FIG. 2B, a resist layer 25 having via holes 24 is formed to the surface of the first conductor layer 10 and, after etching the metal layer 22b exposed to the bottom of the via holes 24, via wirings 26 comprising copper as a main ingredient are formed, for example, by plating to the inside of the via holes 24. The via wirings 26 constitute a third conductor layer.

Figure 2D:
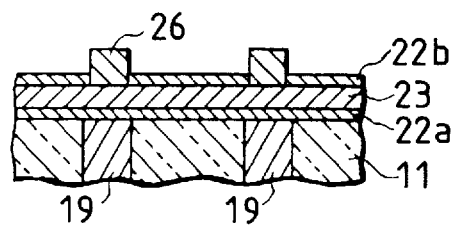
Figure 2E:
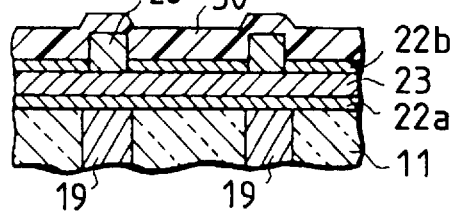

(b-3): Then, after removing the resist layer 25 as shown in FIG. 2D, a photoresist layer 30 is formed as shown in FIG. 2E, to cover the exposed metal layer 22b and the via wirings 26.

Figure 2F:
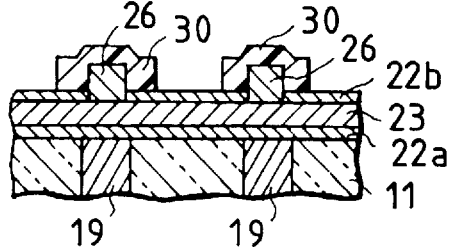
Figure 2G:
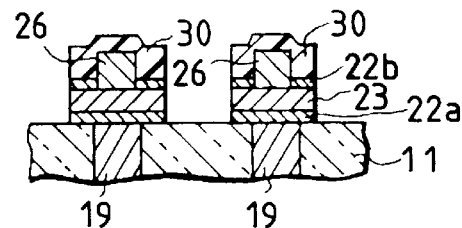
Figure 2H:
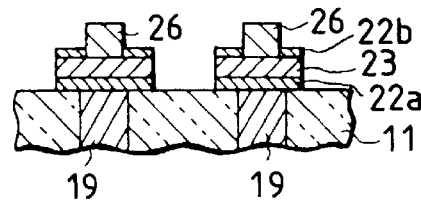

(b-4): The photoresist layer 30 is exposed and developed by using a predetermined mask and, after forming a resist pattern as shown in FIG. 2F, the portions of the conductor layer 23 and the metal layers 22a, 22b not covered with the resist are etched as shown in FIG. 2G, and the photoresist layer 30 is removed as shown in FIG. 2H.

Figure 2I:
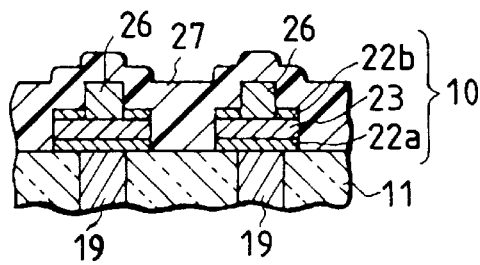
Figure 2J:
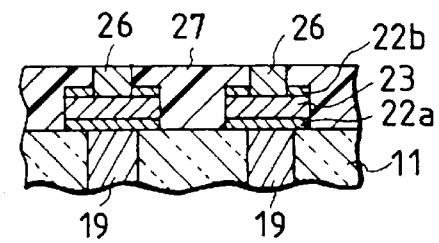

(b-5): A solution containing a polyimide precursor (polyimide precursor composition) is coated from above the via wirings 26 and the first conductor layer 10 over the entire surface of the underlying layer 11 having the conductor layer 10 formed thereon by spin-coating or the like, and heat-cured by baking, to obtain a polyimide layer 27 as shown in FIG. 2I. The polyimide layer 27 is polished flat till the via wirings 26 are exposed as shown in FIG. 2J.

Figure 2K:
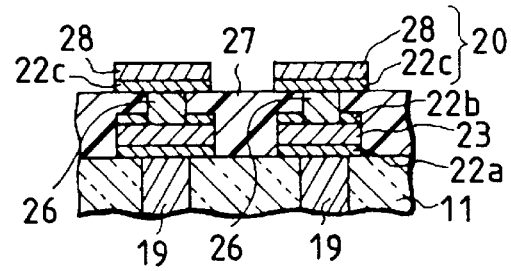
Figure 2L:
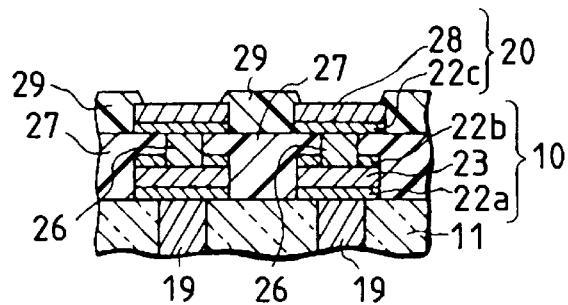

(b-6): Then, a layer 22c of a metal material such as chromium, titanium, molybdenum or tungsten, and a conductor layer 28 comprising nickel as a main ingredient are formed, for example, by sputtering to the surface of the polyimide layer 27 and the exposed via wirings 26 to obtain a second conductor layer 20. After forming a resist of a predetermined pattern on the obtained second conductor layer 20, when the second conductor layer 20 is etched to form a pattern, and the resist is removed, the second conductor layer 20 of a predetermined pattern is obtained as shown in FIG. 2K.

(b-7): In a case of mounting other electronic parts on the underlying layer 11 by connecting the second conductor layer 20 and electrodes of the electronic parts by means of soldering, it is sometimes necessary that solder does not spread by wetting of the periphery of the pattern for the second conductor layer 20. For this purpose, a second polyimide layer 29 of a predetermined pattern is formed, as shown in FIG. 2I, in the same manner as described above in (a-2) and (a-3) on the conductor layer 28 comprising nickel as a main ingredient.

The structure of the metalization structure according to the present invention described above is to be explained with reference to concrete examples.

Figure 7A:
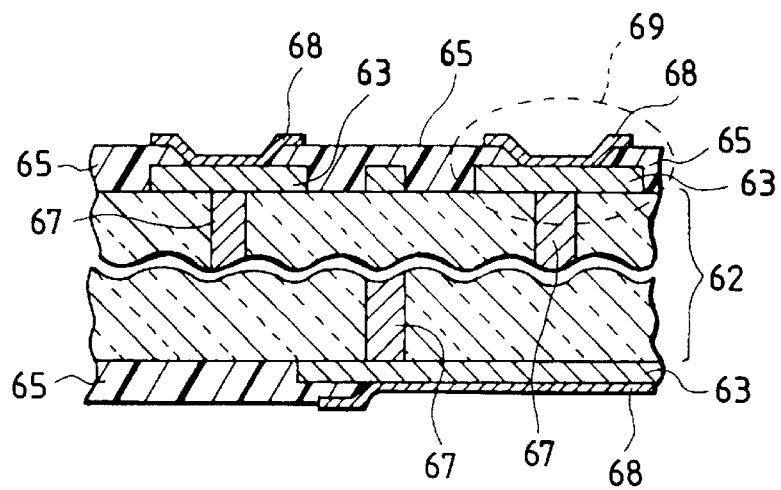
FIG. 7 is a fragmentary cross sectional view for a metalization structure according to the present invention.

At first, there can be mentioned a structure as shown in FIG. 7A. For obtaining a metalization structure having such a structure, after disposing an aligning pad 63 to the surface of a metalization substrate 62 having wirings 67 made of Cu or W, the aligning pad 63 is covered with a polyimide film 65, a portion of the polyimide film 65 is removed to expose a portion (central portion) of the surface of the aligning pad of an underlying layer, and an electrode 68 is formed to the exposed portion. Such fabrication provides a metalization structure in which the end of the polyimide insulative film 65 is present between the end of the electrode 68 and the end of the aligning pad 63.

Figure 8:
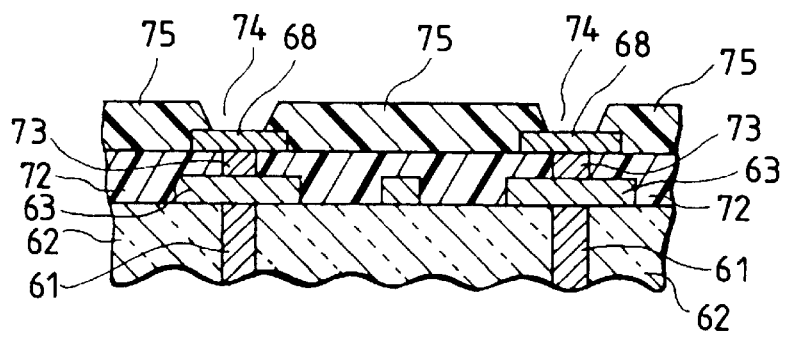
FIG. 8 is a fragmentary cross sectional view for a metalization structure according to the present invention.

The metalization structure can be obtained also by an alternative method, as shown in FIG. 8, of disposing an aligning pad 63 on the surface of a metalization substrate 62, then covering the aligning pad 63 with a first polyimide film 72, aperturing through holes in the polyimide film 72, filling copper by plating in the through holes to form via wiring 73, then forming electrodes 68 so as to be connected with the via wiring 73 and, further, forming a second polyimide layer 75 on the surface (excepting for portions 74 for electric conduction with the electrode). This method can also provide a metalization structure in which the end of the polyimide insulation film 72 is present between the end of the electrode 68 and the end of the aligning pad 63 in the same manner as described above.

Thus, in the method of manufacturing the metalization structure by forming the polyimide film between the end of the electrode 68 and the aligning pad 63, since the end of the aligning pad 63 is covered with the polyimide, erosion of the aligning pad 63 with the etching solution for the electrode 68 can be prevented. Further, since the end of the electrode 68 is not in direct contact with the aligning pad 63, if Ni—W is used as the electrode, the film stress neither causes the conductor portions 74 and the electrodes 68 to peel entirely from the substrate nor results in cracking or chipping to the wiring substrate 62 as the underlying layer.

Figure 7B:
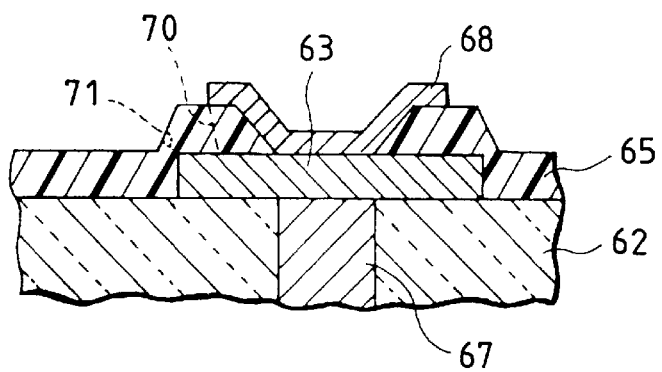

However, in the method of interposing the polyimide film between the end of the electrode 68 and the end of the aligning pad 63, cracking may possibly occur to the polyimide film 65 if the electrode is made of Cr/Ni—W (dual layer structure of a Cr layer and an Ni—W alloy layer). The cracking in the polyimide film 65 occurs just after the etching of the Cr/Ni—W electrode and it is considered to be attributable to large stresses (800 to 1,000 MPa) resulting from Ni—W. Typical portion suffering from cracking in the metalization structure shown in FIG. 7A is illustrated with dotted lines 70 and 71 in FIG. 7B. FIG. 7B is an enlarged view for a portion 69 in FIG. 7A surrounded by the dotted line. The cracking is generally classified depending on the location of occurrence into three cases of occurring to an edge of the Cr/Ni—W electrode 68 (shown by dotted line 70), occurring in the an edge of the Cr/Cu/Cr aligning pad 63 (shown by dotted line 71), and occurring in a region having no concerns with the conductor portion (not illustrated).

Cracking in the polyimide film causes insulation failure or contamination of internal conductors to remarkably deteriorate the reliability of the metalization structure. In view of the above in accordance with the present invention, occurrence of the cracking in the polyimide film has been studied specifically.

The force of a film exerting on its underlying layer (film force) is determined as a product of a film stress and a film thickness. Accordingly, in order to reduce the force exerting on the polyimide film as the underlying layer of the conductor layer, it is necessary to reduce at least one of the film stress and the film thickness of the conductor layer.

Considering at first to the film thickness, it is at least desirable that the thickness of the layer made of a conductor material comprising nickel as a main ingredient is not more than 3 μm, and it is further preferred that the film thickness of the entire second conductor layer is not more than 3 μm. As a result of various experiments, the present inventors, et al have found that the film stress of the nickel film is preferably not more than 500 MPa, and the film force of the nickel film is preferably not more than 1,500 Pa·m. This is because the film force can be reduced to not more than 1,500 Pa·m at a film stress of 500 MPa if the film thickness is not more than 3 μm as described previously.

Considering then to the film stress, the stress resulting from the conductor comprising nickel as a main ingredient or the conductor comprising copper as a main ingredient can be reduced to some extent by improving the forming method. For example, a nickel film of relatively low film stress can be obtained by forming with plating or RF (Radio Frequency) sputtering. Table 1 shows the film stress depending on the method of forming the nickel film. In Table 1, RF means radio frequency sputtering and DC means direct current sputtering.

TABLE 1

Stress behavior of Ni

| Forming method | Just after forming | After treatment at 350 ~ 400° C. |
|---|---|---|
| Plating | 50 ~ 200 MPa* | 800 ~ 1500 MPa |
| Sputtering DC | 600 ~ 1000 MPa | 1000 ~ 1500 MPa |
| RF | 200 ~ 500 MPa | 400 ~ 600 MPa |

*Approximate value

However, there is a limit for reducing the stress. Further, in the nickel film not subjected to a heat treatment at 300° C. or higher, stress is increased by heating as can be seen from Table 1. The temperature upon forming the nickel film is from room temperature to 50° C. in the plating method, while it is usually from 150° to 250° C. in the sputtering method, and the heat treatment to the nickel film is necessary, for example, for the reduction of an oxide film on the nickel surface, mounting of LSI or the like or soldering upon sealing the module surface. Accordingly, the foregoing problems can not always be dissolved completely only by the improvement for the method of forming the conductor film.

Then, as a result of earnest studies, the present inventors have found that cracking scarcely occurs to the polyimide film even when a conductor comprising nickel as a main ingredient is used for the electrode, in a case of using a polyimide of low thermal expansion coefficient as the insulative film.

Considering the cause for the occurrence of the cracking in the polyimide film based on the result in a case of using the polyimide of low thermal expansion coefficient, the mechanism is assumed as below. A conductor layer comprising nickel as a main ingredient gives a tensile stress to the underlying layer thereof. On the other hand, the polyimide undergoes the tensile stress from the substrate due to mismatching of the thermal expansion coefficient with respect to the substrate material as the underlying layer. The two tensile stresses in the same direction are joined and exert as a force of tearing the polyimide film and, as a result, cause the cracking to the polyimide film.

If the two tensile stresses are considered as the cause for the cracking, it is necessary to reduce at least one of the two tensile stresses in order to suppress occurrence of the cracking in the polyimide film. However, there is a limit for reducing the stress of the conductor layer comprising nickel as a main ingredient as described above. Then, it is desirable to reduce the stresses exerting from the substrate to the polyimide itself. For this purpose, it is effective to reduce the mismatching of the thermal expansion coefficient between the substrate material and the polyimide, that is, to use a polyimide of low thermal expansion coefficient (thermal expansion coefficient within a range from a heat expansion coefficient of the substrate, for example, 3.0±0.5×10−6/K in glass ceramic substrate, to 25×10−6K.)

Accordingly, in the present invention, it is desirable to use a polyimide of low thermal expansion coefficient as the polyimide disposed between the end of the conductor layer comprising nickel as a main ingredient and the end of the conductor layer comprising copper as a main ingredient. As a result of further various studies, the present inventors, et al have found that the use of the following polyimides (i) and (ii) as the polyimide of low thermal expansion coefficient is preferred.

(i): A polyimide having repeating units represented by the following general formula (1):

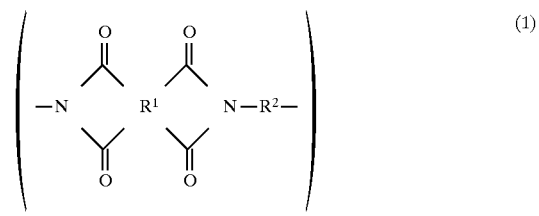

where R1 represents at least one tetravalent organic group selected from the following structural formulae (2) and R2 represents at least one bivalent organic group selected from the following structural formulae (3):

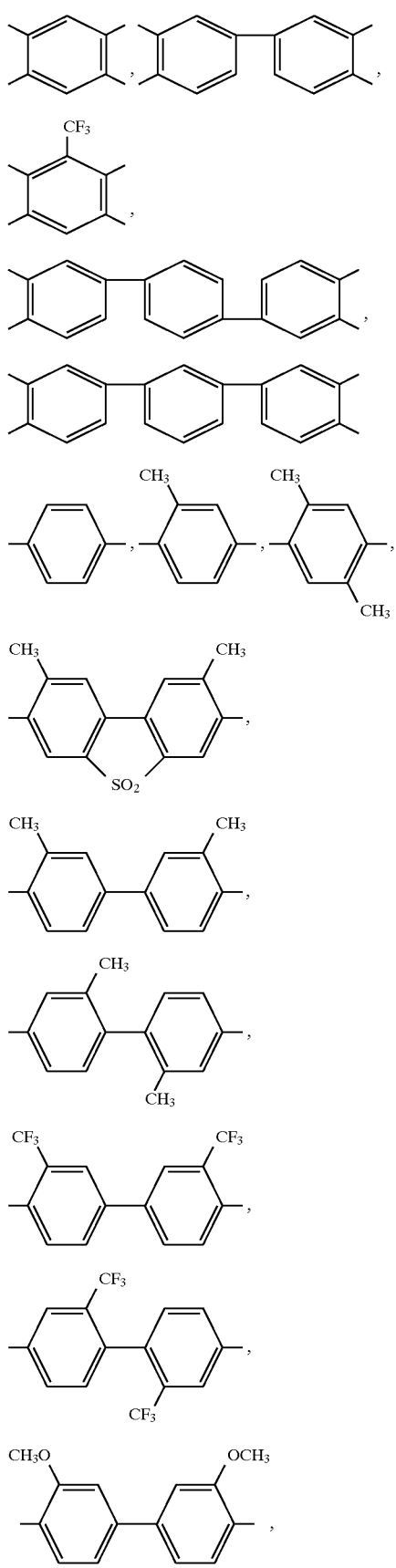

(2)

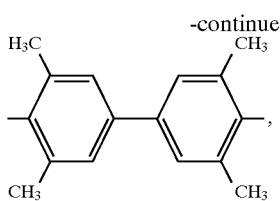

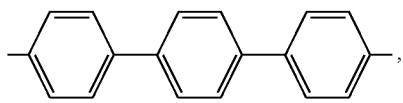

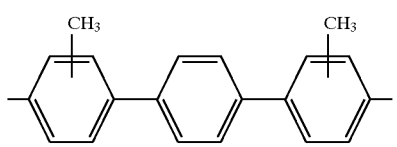

(3)

(ii): A polyimide having repeating units represented by the following general formula (4):

$$\left( -N \underset{\underset{O}{\overset{\parallel}{C}}}{\overset{\overset{O}{\parallel}}{\underset{C}{\overset{C}{\diagdown}}}} R^3 \underset{\underset{O}{\overset{\parallel}{C}}}{\overset{\overset{O}{\parallel}}{\underset{C}{\diagup}}} N-R^5- \right) \quad (4)$$

where R3 represents at least one tetravalent organic group selected from the following structural formulae (6) and at least one tetravalent organic group selected from the following structural formulae (7):

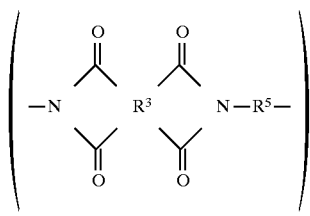

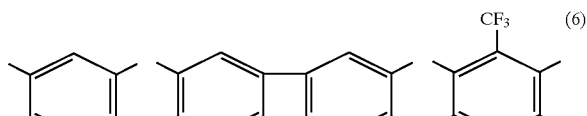 (6)

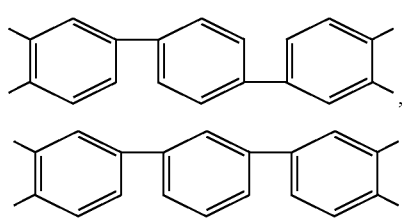

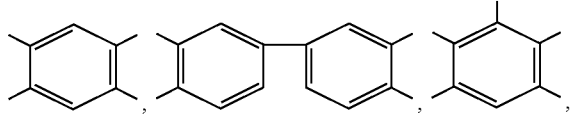 (7)

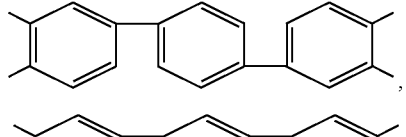

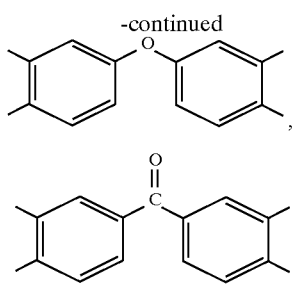

which are present in admixture in one molecule, at a constitutional ratio of 60 to 100 groups contained in (6) and 0 to 40 groups (excluding 0) contained in (5), based on the number of R3 in the molecule as 100. Further, R5 represents at least one bivalent organic group selected from the following structural formulae (8) and at least one bivalent organic group selected from the following structural formulae (9):

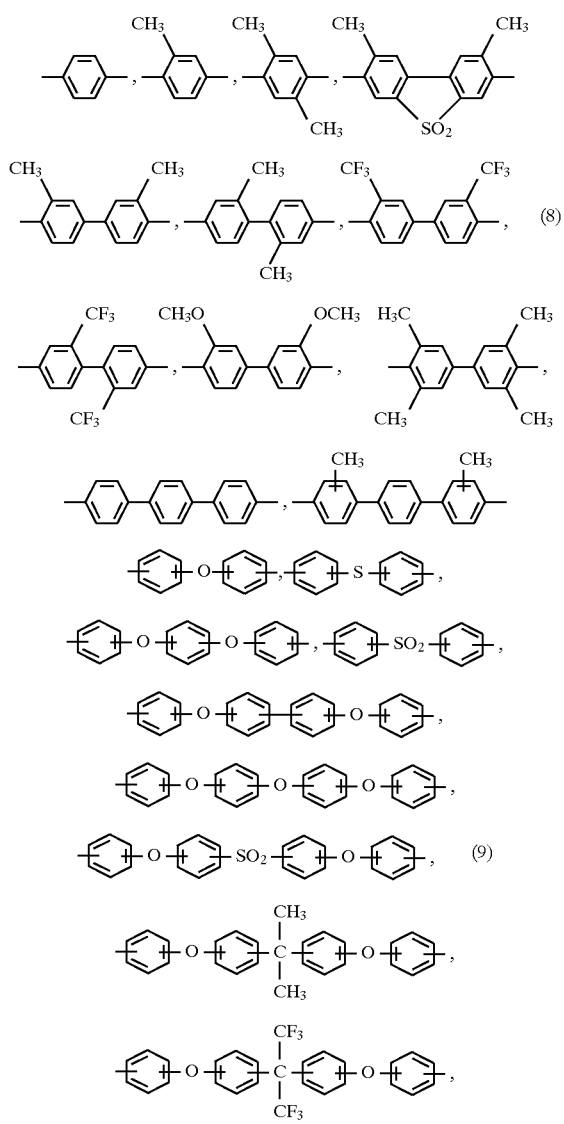

which are present in admixture in one molecule at a constitutional ratio of 60 to 100 groups contained in (8) and 0 to 40 (excluding 0) groups contained in (9), based on the number of R5 in the molecule as 100.

Among the polyimide (i), the following polyimide (iii) or (iv) is particularly preferred.

(iii): A polyimide comprising repeating units represented by the following general formula (10) and repeating units represented by the following general formula (11), in which the number of the repeating units represented by (10) is not more than 95 and the number of the repeating units represented by (11) is not less than 5, based on the total number of the repeating units represented by (10) and the repeating units represented by (11) as 100.

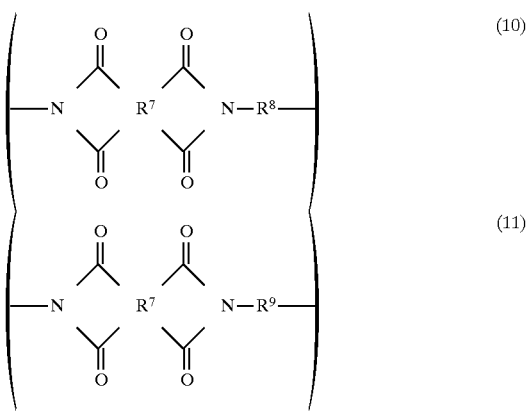

where R7 is at least one tetravalent organic group selected from the following structural formulae (12), R8 is at least one bivalent organic group selected from the following structural formulae (13), and R9 is at least one bivalent organic group selected from the following structural formulae (14):

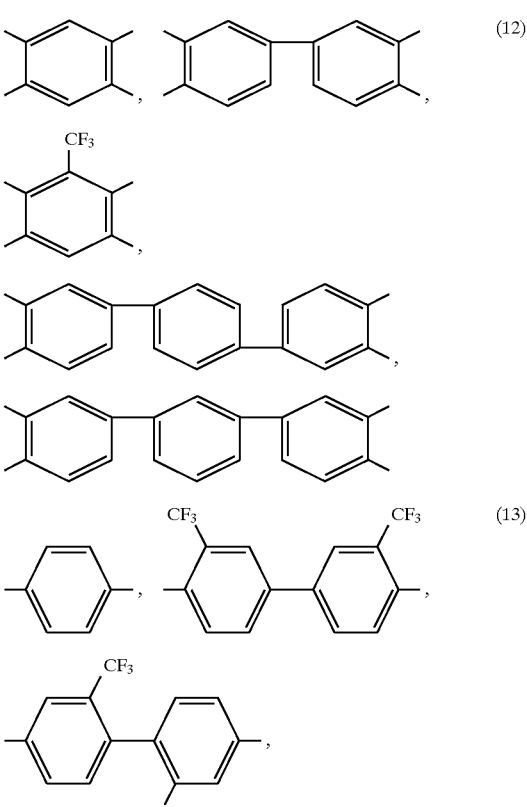

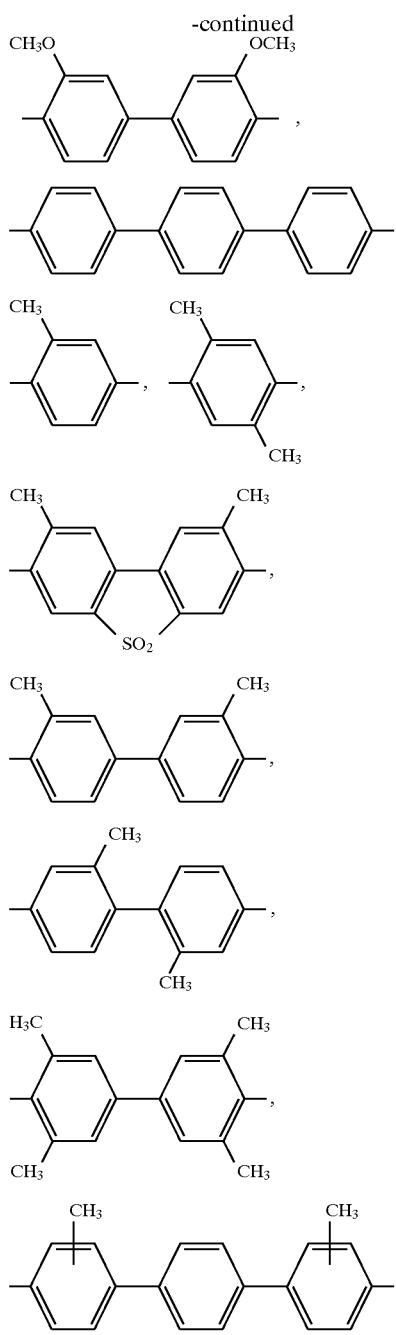

(iv): A polyimide comprising repeating units represented by the general formula (11) described above.

All the polyimides (i) to (iv) have low thermal expansion coefficient from 4 to 25×10–6, and low stress of not more than 3 to 35 MPa can be attained to provide an effect of suppressing the cracking, while usual polyimides generate stresses of 40 to 50 MPa when formed to substrates such as of silicon.

Further, the polyimides (i) to (iv) not only have low thermal expansion coefficient but also have greater tensile modulus of elasticity which amounts as high as 5 to 12 GPa that is greater than about 3 GPa as the value for usual polyimides. As a result, the polyimides have large tensile strength. Accordingly, when the polyimides are used for forming the insulative layer as the underlying layer for the conductor layer comprising nickel as a main ingredient, since resistance to tearing force to the polyimide film is increased, it provides an effect of further suppressing the cracking.

Further, the polyimides (ii) to (iv) have an effect of increasing adhesion to the conductor layer formed to the upper layer and suppressing peeling of the upper layer conductor.

In the polyimide (ii), since an organic group ingredient having an ether bond is introduced into the polyimide molecular chain, adhesion to the conductor is increased. The organic group ingredient having the ether bond is excellent, by nature, in the bondability with a metal to be formed on the surface but, on the contrary, this constitutes an inhibiting factor for attaining the low thermal expansion coefficient or the high tensile strength of the polyimide. Accordingly, it is desirable to restrict the ratio of introducing the organic group ingredient having the ether bond within a range described above. The low thermal expansion coefficient, the high tensile strength and the high adhesion of the polyimide can be attained by restricting the amount of the organic group ingredient having the ether bond within the above-mentioned range.

Further, in the polyimides (iii) and (iv), since the organic group ingredient having a methyl-substituted aromatic ring is introduced into the polyimide molecular chain, adhesion to the conductor is increased. This is because the organic group having a methyl-substituted aromatic ring can form an extremely active surface by the treatment, for example, oxygen ashing or sputtering using argon ions. The ratio of the organic group having the methyl-substituted aromatic ring is preferably not less than 5% and a sufficient effect can be attained if it is 5 to 100%.

In the present invention, the polyimide is obtained by heat-curing of a polyimide precursor varnish which is a polyimide precursor composition (polyimide precursor solution). The polyimide used in the present invention has an average molecular weight, preferably, from 10,000 to 100,000, more preferably, 40,000 to 50,000. The polyimide precursor composition can be obtained easily by stirring necessary tetracarboxylic acid dianhydride and diamine in an organic polar solvent to cause polymerizing reaction thereby forming a polyimide precursor (polyamic acid). It is preferred that the total amount of the acid dianhydride and the total amount of the diamine are substantially equal with each other from a stoichiometrical point of view.

As the polar solvent described above, there can be used, for example, 1-methyl-2-pyrrolidone, N,N-dimethyl acetoamide, N,N-dimethyl formamide, dimethyl sulfoxide, hexamethyl phosphor amide, tetramethylene sulfone, p-chlorophenyl, and p-bromophenol. The solvents may be used alone or as a mixture of them. However, the solvent is not always restricted only thereto, so long as the solvent can dissolve the polyimide precursor.

The polyimide precursor composition preferably contains a photosensitive ingredient. If the polyimide precursor composition contains a photosensitive ingredient, it can be fabricated into a desired pattern by applying exposure and development by way of a photomask with no particular use of a photoresist.

The tetracarboxylic acid dianhydride as a starting material for obtaining a polyamide acid as the precursor of the polyimide (1) is a compound represented by the following general formula (15):

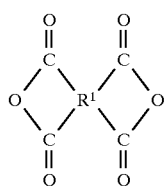
(15)

where R1 is a tetravalent organic group selected from the following structural formulae (2):

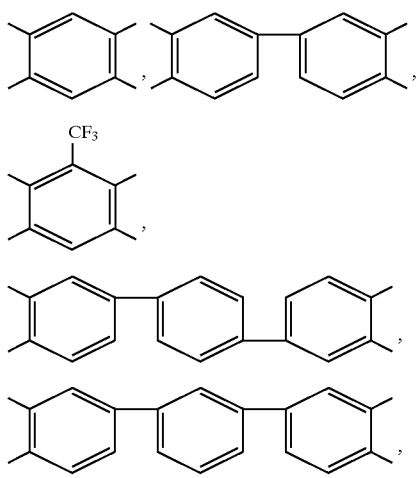
(2)

and the diamine compound is a compound represented by the following general formula (16):

H₂N—R²—NH₂ (16)

where R2 is a bivalent organic group selected from the following structural formulae (3):

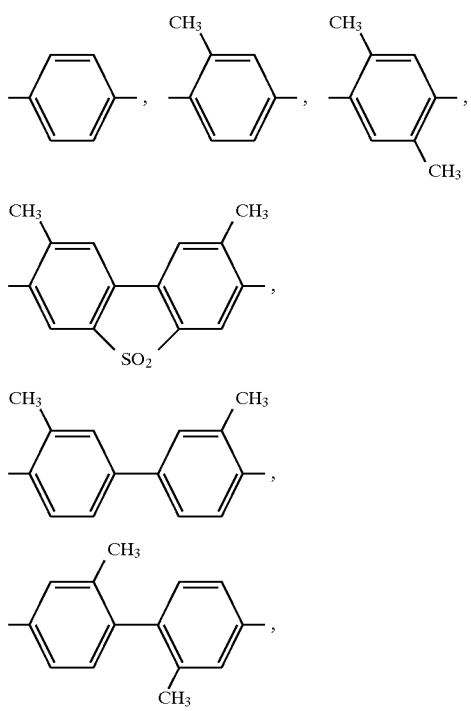
(3)

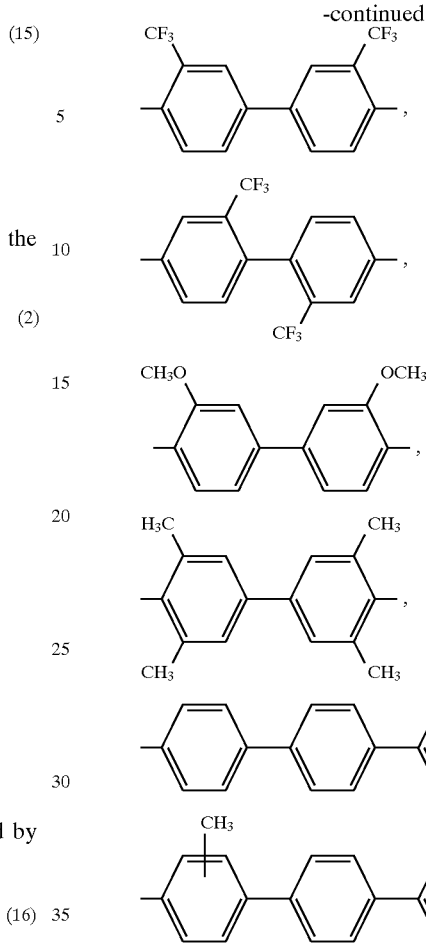

As the tetracarboxylic acid dianhydride, a compound selected from the compounds represented by the general formula (15) may be used, and a plurality of compounds represented by the general formula (15) may be used in combination.

The tetracarboxylic acid dianhydride as the starting material for obtaining the polyamic acid as the precursor of the polyimide (ii) is a compound represented by the following general formula (17) and a compound represented by the following general formula (18):

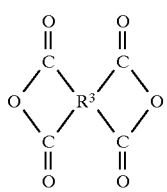
(17)

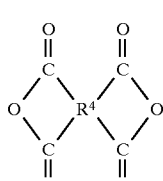
(18)

where R3 is a tetravalent organic group selected from the following structural formulae (6) and R4 is a tetravalent organic group selected from the following structural formulae (7):

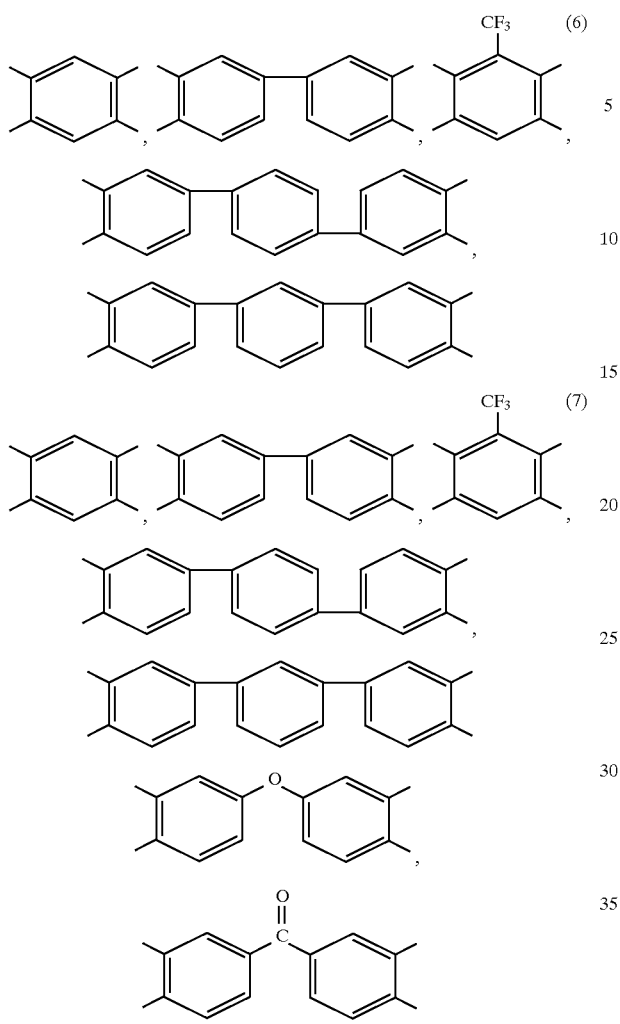

and the diamine compound is a compound represented by the following general formula (19) and a compound represented by the following general formula (20):

$$H_2N-R^5-NH_2 \quad (19)$$

$$H_2N-R^6-NH_2 \quad (20)$$

where R5 is a bivalent organic group selected from the following structural formulae (8), and where R6 is a bivalent organic group selected from the following structural formulae (9):

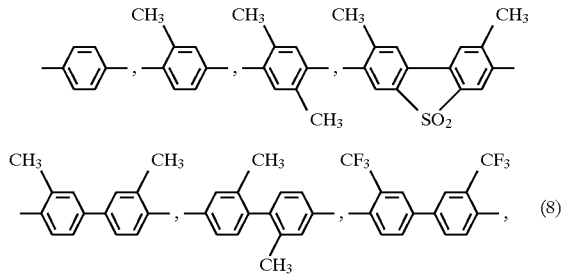

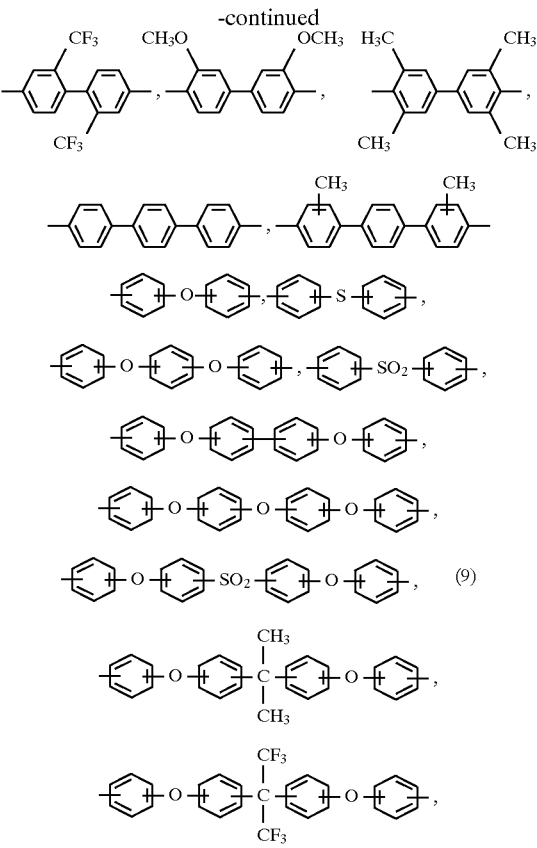

The respective compounds mentioned above may be a combination of a plurality of compounds selected from the compounds represented by the corresponding general formulae, or may consist only one kind of them.

The tetracarboxylic acid dianhydride as the starting material for obtaining the polyamic acid as the precursor of the polyimide (iii) is a compound represented by the following general formula (21):

where R7 is a tetravalent organic group selected from the following structural formulae (12):

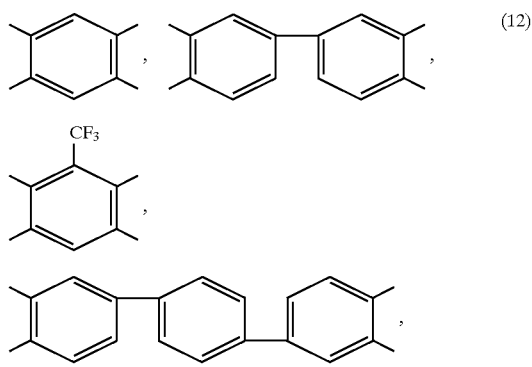

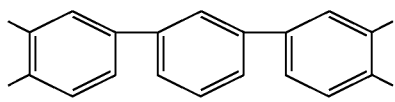

and the diamine compound is a compound represented by the following general formula (22) and a compound represented by the following general formula (23):

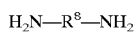 (22)

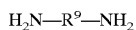 (23)

where R8 is a bivalent organic group selected from the following structural formulae (13), and where R9 is a bivalent organic group selected from the following structural formulae (14):

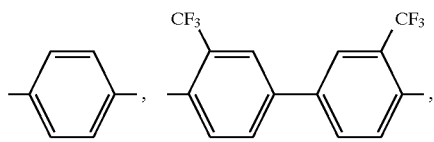 (13)

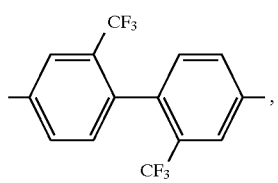

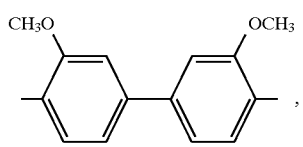

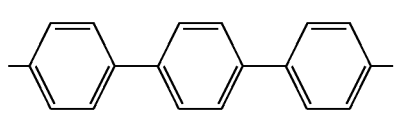 (14)

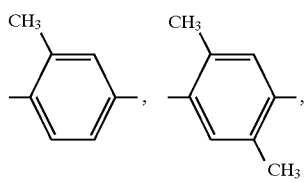

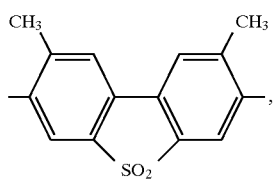

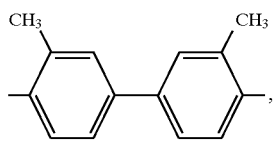

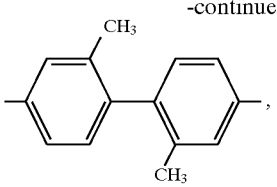

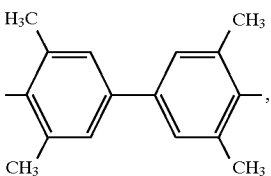

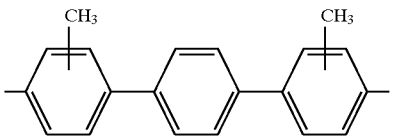

In the same manner as described above, the respective compounds may be a combination of a plurality of compounds selected from the compounds represented by the corresponding general formulae, or may consist only one kind of them.

Among the starting materials (iii), when the starting materials (acid dianhydride represented by the general formula (21) and the diamine compound represented by the general formula (23)), expecting for the compound represented by the general formula (22), are chemically reacted, a polyamic acid as a precursor of the polyimide (iv) is obtained.

As described above, the polyimides (i) to (iv) cause no cracking if a conductor layer having a high film stress, for example, a nickel film is formed on the surface. Accordingly, the insulative film containing such polyimides is not only used for the moderation of the stress between the first conductor layer and the second conductor layer as described above, but also effective as the underlying layer for the conductor layer of high film stress even in a constitution not provided with such two conductor layers.

As explained above, the following two subjects (1) and (2) can be overcome in accordance with the present invention.

(1): Prevention of cracking or chipping caused to the underlying layer of a first conductor layer in a case where a conductor layer comprising nickel as a main ingredient is directly formed on the first conductor layer.

(2): Prevention of cracking caused to a polyimide layer in a case where the polyimide layer is disposed between the end of the conductor layer comprising nickel as a main ingredient and the first conductor layer as a means for solving the subject (1).

In accordance with the present invention, the subject (1) can be solved by separating at least an end of a second conductor layer made of a conductor comprising nickel as a main ingredient from a first conductor layer made of a conductor comprising copper as a main ingredient by a polyimide insulative film such that they are not in direct contacting with each other. This is because the stress concentration resulting from the two conductors to the underlying layer is moderated by the polyimide layer. However, an insulative film comprising the polyimide as a main ingredient is disposed below the conductor layer comprising nickel as a main ingredient, on the other hand, which causes a risk of the cracking. This is the subject (2).

In view of the above, the subject (2) is overcome by using a polyimide suitable to the constitution for the means for the subject (1). That is, in the present invention, it is desirable to use a polyimide of low thermal expansion coefficient in which the stress exerted from the substrate to the polyimide per se is reduced and, further, preferably, use a polyimide having a high tensile strength and high adhesion to the conductor of the conductor layer formed on the polyimide layer.

Then, explanation will be made to preferred embodiments according to the present invention. In each of synthesis examples described latter, E type viscometer (DV□-E type digital viscometer (manufactured by Tokimec Co.)) was used for the measurement of the viscosity. Further, the unit of the non-volatile content is wt/wt %, which is determined by dividing the total weight of the solids (sum of the weight for the entire solutes) with the sum of the total weight of the solids and the total weight of the solvent, and then multiplying the obtained fraction with 100.

Abbreviations to be used in each of the following synthesis examples, examples and comparative examples are set forth below.

PMDA: pyromellitic acid dianhydride

BTDA: 3,3',4,4'-benzophenone tetracarboxylic acid dianhydride

BPDA: 3,3',4,4'-biphenyl tetracarboxylic acid dianhydride

ODPA: 3,3',4,4'-oxyphthalic acid dianhydride

TPDA: p-terphenyl-3,3", 4,4"-tetracarboxylic acid dianhydride m-TPDA: m-terphenyl-3,3",4,4"-tetracarboxylic acid dianhydride DDE: 4,4'-diaminodiphenyl ether BAPB: 4,4'-bis(4-aminophenoxy)biphenyl BAPP: 2,2-bis[4-(4-aminophenoxy)phenyl]propane PDA: p-phenylenediamine DMBP: 3,3'-dimethyl-4,4'-diaminobiphenyl DATP: 4,4"-diamino-p-terphenyl MDAP: dimethylaminopropyl methacrylate MDAE: dimethylaminoethyl methacrylate BISAZ: bis(4-azidebenzal)-4-carboxycyclohexanone DAZB: 3,3'-dimethoxy-4,4'-diazidebiphenyl DMAc: N,N-dimethyl acetamide NMP: 1-methyl-2-pyrrolidone

[Synthesis Example 1]

At a room temperature and in a nitrogen gas stream, 9.55 g of 3,3'-dimethyl-4,4'-diaminobiphenyl (DMBP) as a diamine ingredient and 11.35 g of p-phenylenediamine (PDA) were dissolved under stirring in 368.5 g of 1:1 solvent mixture of N,N-dimethyl acetamide (DMAc) and 1-methyl-2-pyrrolidone (NMP) (weight ratio). The molar ratio of the diamine ingredient is DMBP:PDA=3:7.

Then, 44.12 g of 3,3',4,4'-biphenyl tetracarboxylic acid dianhydride (BPDA) was mixed as the acid dianhydride to a solution of the resultant diamine ingredient and then dissolved under stirring in a nitrogen gas stream (total non-volatile content: 15%).

After adding the acid dianhydride, the reaction solution was stirred in the nitrogen gas stream for six hours to obtain a solution of a polyimide precursor (polyamic acid varnish). The viscosity of the obtained varnish amounted to 60 Pa·s. Further, the solution was stirred for about six hours while being kept in a temperature ranging from 60° to 70° C. to lower the viscosity to 3.7 Pa·s poise, to form a polyimide precursor varnish used for manufacturing a metalization structure.

[Synthesis Examples 2 to 8]

Polyimide precursor varnishes were synthesized by the same method as in Synthesis Example 1 by using the diamine ingredients and the acid dianhydride ingredients shown in Table 2. Table 2 also shows the non-volatile content and the viscosity. Table 2 shows the monomers and non-volatile content in Synthesis Examples 1 to 8, the viscosity of the polyimide precursor compositions prepared in each of the synthesis examples, and the thermal expansion coefficient of the polyimides obtained by heat-curing of the polyimide precursor compositions.

TABLE 2

| | Polymide Precursor Varnish | | | | |
|---|---|---|---|---|---|
| Synthesis Example Number | Acid dianhydride ingredient | Diamine ingredient | Non-volatile content (%) | Viscosity (Pa · s) | Thermal expansion coefficient ($\times 10^{-6}$/K) |
| 1 | BPDA | PDA:DMBP = 7:3 (molar ratio) | 15 | 3.7 | 7 |
| 2 | TPDA | PDA | 15 | 4.0 | 4 |
| 3 | m-TPDA | PDA:DMBP = 7:3 (molar ratio) | 15 | 5.0 | 9 |
| 4 | BPDA:ODPA = 2:1 (molar ratio) | PDA:DMBP = 9:1 (molar ratio) | 15 | 4.5 | 10 |
| 5 | BPDA | PDA:DDE = 8:2 (molar ratio) | 15 | 6.0 | 15 |
| 6 | BPDA | PDA:BAPB = 9:1 (molar ratio) | 15 | 5.0 | 12 |
| 7 | TPDA | DATP:BAPP = 6:4 (molar ratio) | 18 | 4.5 | 17 |
| 8 | PMDA | DMBP:DDE = 7:3 (molar ratio) | 15 | 5.0 | 22 |

In Synthesis Example 4, the reaction solution was obtained by preparing a solution of the diamine ingredient by dissolving the two kinds of diamine ingredients shown in Table 2 into the solvent and adding a previously mixed two kinds of acid dianhydrides.

[Synthesis Example 9]

At a room temperature and in a nitrogen gas stream, 12.01 g of 4,4'-diaminodiphenyl ether (DDE) and 9.73 g of p-phenylenediamine (PDA) as the diamine ingredient were dissolved under stirring to 373.1 g of 1:1 solvent mixture of DMAc and NMP (weight ratio). The molar ratio of the diamine ingredient is DDE:PDA=4:6.

Then, 44.10 g of 3,3',4,4'-biphenyl tetracarboxylic acid dianhydride (BPDA) was mixed to the solution of the resultant diamine ingredient and then dissolved under stirring in a nitrogen gas stream. The total non-volatile content was 15%.

After adding the acid dianhydride, the reaction solution was stirred in a nitrogen gas stream for six hours to obtain a solution of a polyimide precursor (polyamic acid varnish). The viscosity of the obtained varnish amounted to 70 Pa·s. Further, the solution was stirred for about six hours while being kept in a temperature ranging from 60° to 70° C. to lower the viscosity to 1.8 Pa·s poise.

Then, when 51.33 g of dimethylaminopropyl methacrylate (MDAP) (twice mole number of acid dianhydride) and 3.95 g of bis(4-azidebenzal)-4-carboxysulfohexanone (BISAZ) (6% of solid weight) were added as the photosensitive ingredient and stirred for five hours, a polyimide precursor varnish having a viscosity of 3.7 Pa·s was obtained.

[Synthesis Examples 10 and 14]

Polyimide precursor varnishes were synthesized in the same manner as in Synthesis Example 9 using monomers as described in Table 3. Table 3 shows the monomers, the non-volatile content, the viscosity of the polyimide precursor compositions (varnish) obtained in the synthesis examples and the thermal expansion coefficient of the polyimides obtained by heat-curing of the polyimide precursor compositions in Synthesis Examples 9, 10, and 14.

[Synthesis Examples 11 to 14]

Polyimide precursor varnishes were synthesized in the same manner as Synthesis Example 1 using the monomers as described in Table 4. Table 4 shows the monomers, and the non-volatile content, the viscosity of the polyimide precursor compositions (varnish) obtained in the synthesis examples and the thermal expansion coefficient of the polyimides obtained by heat-curing of the polyimide precursor compositions in Synthesis Examples 11 to 13.

TABLE 4

Polyimide Precursor Varnish

| Synthesis Example Number | Acid dianhydride ingredient | Diamine ingredient | Non-volatile content (%) | Viscosity (Pa·s) | Thermal expansion coefficient ($\times 10^{-6}$/K) |
|---|---|---|---|---|---|
| 11 | PMDA | DDE | 15 | 4.0 | 40 |
| 12 | BTDA | DDE | 15 | 3.5 | 45 |
| 13 | BPDA | BAPP | 15 | 3.5 | 50 |

[EXAMPLE 1]

The manufacturing process for the metalization structure in this example is shown in FIG. 3 and FIG. 9.

On a glass type ceramic substrate 31 (150 mm square, 4 mm thickness) having a copper wiring 32 of 60 μm diameter in the inside, were formed a chromium layer 33 (film thickness: 0.07 μm), a copper layer 34 (film thickness: 5 μm) and a chromium layer 35 (film thickness: 0.05 μm) successively by DC sputtering. A resist was applied from above the metal layers 33 to 35 to the surface of the substrate 31 formed with the metal layers 33 to 35 (hereinafter referred to as a substrate surface) by spin-coating and heated in a nitrogen atmosphere at 90° C. for 30 min. Then, after exposure by using a predetermined mask, development and rinsing, they were heated in a nitrogen atmosphere at 140° C. for 30 min and etched from the upper layer in a predetermined pattern in the order of the chromium layer 35, the copper layer 34 and the chromium layer 33. Then, the resist

TABLE 3

Polyimide Precursor Varnish

Figure 3A:
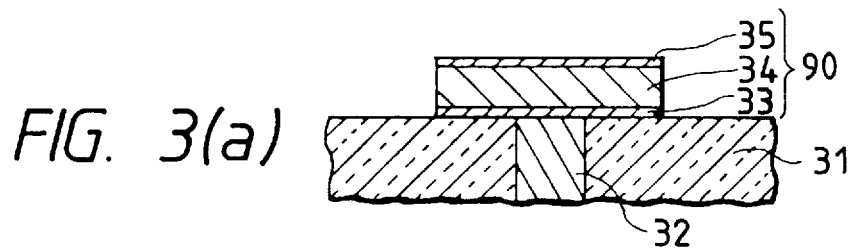
FIG. 3 is a schematic view illustrating an embodiment of a manufacturing method for a metalization structure according to the present invention.

| Synthesis Example Number | Acid dianhydride ingredient | Diamine ingredient | Photo-sensitive ingredient | Non-volatile content (%) | Viscosity (Pa·s) | Thermal expansion coefficient ($\times 10^{-6}$/K) |
|---|---|---|---|---|---|---|
| 9 | BPDA | PDA:DDE = 6.4 (molar ratio) | MDAP:twice mole number of acid dianhydride BISAZ:6% of solid weight | 15 | 3.7 | 25 |
| 10 | PMDA | PDA:DDE = 6.4 (molar ratio) | MDAE:twice mole number of acid dianhydride DAZB:6% of solid weight | 15 | 4.0 | 25 |
| 14 | BPDA | DDE | MDAP:twice mole number of acid dianhydride BISAZ:6% of solid weight | 15 | 3.5 | 35 | was removed to obtain a pad (first conductor layer) 90 of a thickness of 5.12 μm and a diameter of 180 μm, comprising chromium/copper/chromium three layers of a predetermined pattern as shown in FIG. 3A.

Figure 3B:
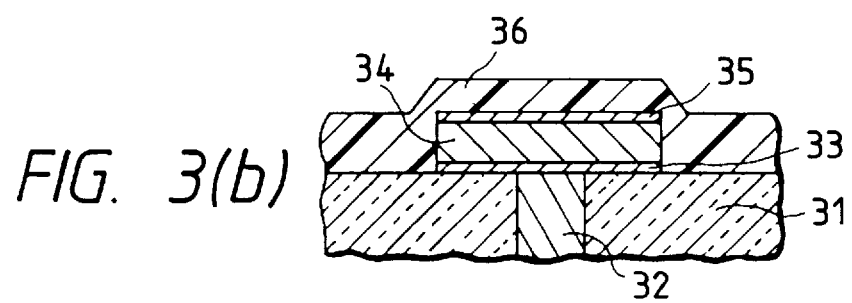

Then, for increasing the adhesion strength between a polyimide layer to be formed and the first conductor layer 90 as the underlying layer therefor, a 1% solution of aluminum monoethyl acetate diisopropylate was coated on the first conductor layer and the substrate surface and heat-treated at 200° C. for 60 min under air atmosphere. A polyimide precursor varnish synthesized in Synthesis Example 1 was applied by spin-coating to the first conductor layer and the substrate surface applied with the surface treatment, and then they were baked at 140° C. for 60 min to obtain a prebaked film 36 of the polyimide precursor as shown in FIG. 3B.

Figure 3C:
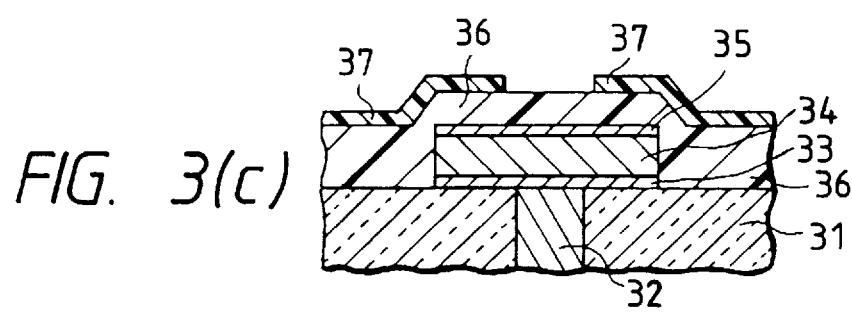
Figure 3D:
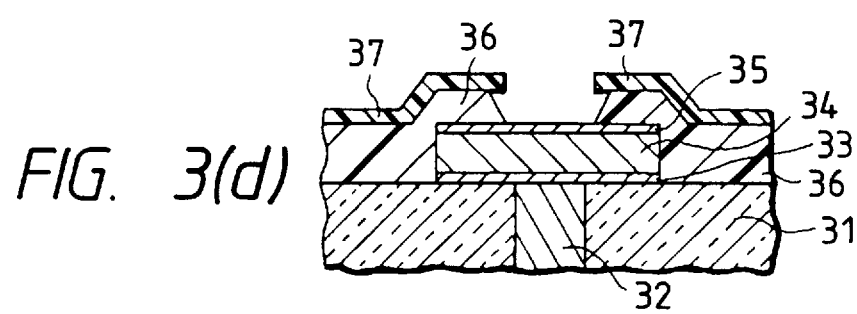

A negative type rubber resist 37 was applied by spin-coating to the surface of the prebaked film 36, and they were baked at 90° C. for 60 min, and after exposure by using a predetermined mask, development and rinsing, ashing was applied for three minutes to obtain a resist layer 37 of a predetermined pattern as shown in FIG. 3C. Then, they were immersed in an aqueous solution of tetramethyl ammonium hydroxide (2.4% by weight) to etch the prebaked film 36 and expose the underlying chromium layer 35 as shown in FIG. 3D.

Figure 3E:
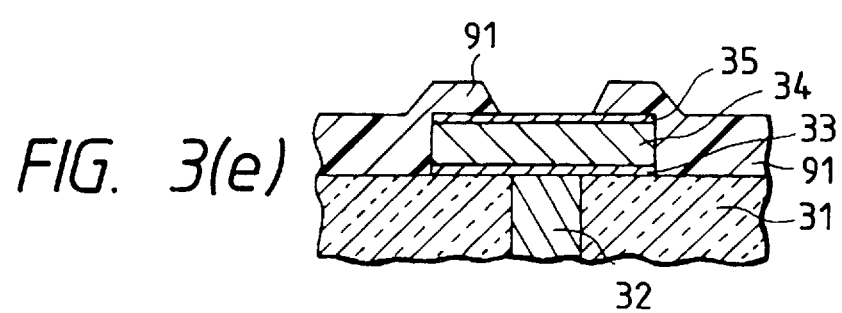

Then, after removing the resist 37 with a stripping solution, baking was applied at 140° C. for 60 min, at 200° C. for 60 min and at 350° C. for 60 min successively in a nitrogen gas stream to heat-cure the polyimide precursor of the prebaked film 36 to obtain a polyimide film 91 (film thickness: 8 μm) shown in FIG. 3E.

Figure 9A:
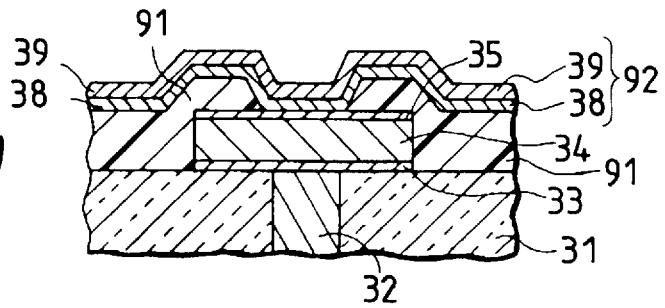
FIG. 9 is a schematic view illustrating an embodiment of a manufacturing method for a metalization structure according to the present invention.

After sputtering the surface of the obtained polyimide film 91 by argon ions, a chromium layer 38 (film thickness: 0.05 μm) and a conductor layer 39 (film thickness: 2.0 μm) comprising a nickel-tungsten alloy comprising nickel as a main ingredient (Ni:W=93:7 (weight ratio) in this example) were formed successively by DC sputtering to obtain a second conductor layer 92 as shown in FIG. 9A.

Figure 9B:
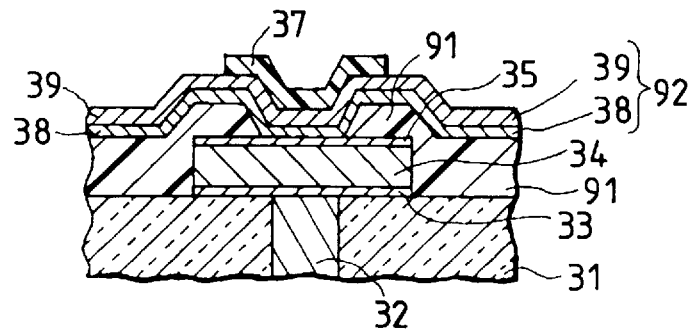
Figure 9C:
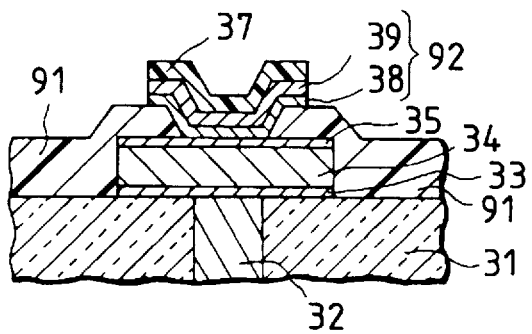

Then, a resist was applied by spin-coating to the surface of the conductor layer 39, and they were heated in a nitrogen atmosphere at 90° C. for 60 min, exposed by using a predetermined mask, developed, rinsed and then heated in a nitrogen atmosphere at 160° C. for 60 min to obtain a resist layer 37 of a predetermined pattern as shown in FIG. 9B. Subsequently, the conductor layer 39 and the chromium layer 38 were etched in this order to form the second conductor layer into a predetermined circular pattern of 150 μm in diameter as shown in FIG. 9C. Then, when the resist was removed by the stripping solution, a surface electrode comprising the second conductor 92 was exposed to complete a module substrate shown in FIG. 9D.

In the manufactured module substrate, cracking, chipping or peeling was not observed in any of the polyimide films in contact with the second conductor layer 92, the first conductor layer 90 and the ceramic substrate 31, and satisfactory electrical conduction was obtained throughout the wirings.

Figure 4:
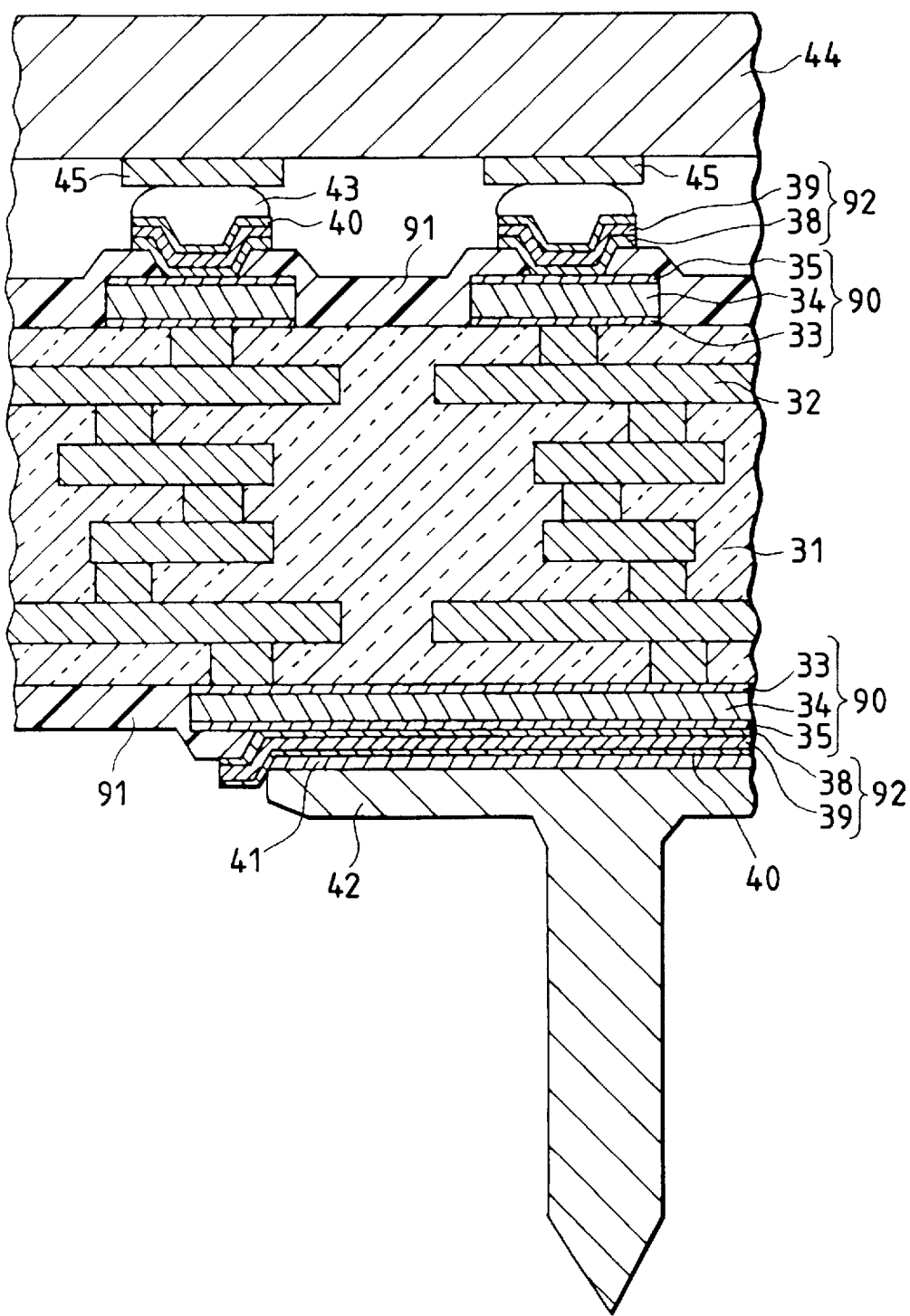
FIG. 4 is a schematic view illustrating an embodiment of a multichip module manufactured according to the present invention.

Further, as shown in FIG. 4, a first conductor layer 90, a polyimide layer 91 and a second conductor layer 92 were formed in the same manner as for the surface also to the remaining rear face of the substrate 31, kept in a hydrogen gas atmosphere at 350° C. for 30 min, and then gold plating was applied to the surface of the conductor layer 39 on both surface and rear face of the substrate 31 to form gold layers 40. For the gold layers 40, an input/output pin 42 was erected by way of solder 41 to the layer on the rear face, while an electrode 45 of LSI (Large Scale Integration) 44 was connected by way of solder 43 to the layer on the surface.

With the procedures as described above, a multichip module shown in FIG. 4 carrying thereon LSI 44 was completed. Failure such as cracking, chipping or peeling was not observed in the obtained multichip module and satisfactory electric conduction and operation characteristic were obtained throughout the wirings.

[EXAMPLES 2 TO 8]

When module substrates were prepared by the same method as in Example 1, by using varnishes obtained in Synthesis Examples 2 to 8 instead of the varnish obtained in Synthesis Example 1 as the polyimide precursor varnishes, cracking, chipping or peeling was not observed for the polyimide film in contact with the second conductor layer 92, the first conductor layer 90, and the ceramic substrate 31 and satisfactory electric conduction was obtained throughout the wirings in the module substrates obtained by using any of the varnishes.

Further, when a multichip module shown in FIG. 4 was prepared by the same method as in Example 1 using the module substrates obtained in the examples, failure such as cracking, chipping or peeling was not observed, and satisfactory electric conduction and operation characteristic were obtained throughout the wirings in the obtained multichip modules.

[EXAMPLE 9 AND 10]

A prebaked film 36 is shown in FIG. 3B was obtained in the same manner as in Example 1 by forming patterns of a chromium layer 33, a copper layer 34 and a chromium layer 35 successively on a substrate 31 as shown in FIG. 3A, then coating a 1% solution of aluminum monoethyl acetate diisopropylate, applying a surface treatment by heat treatment in an oxygen atmosphere at 200° C. for 60 min, then applying by spin-coating the polyimide precursor varnish obtained in Synthesis Example 9 or Synthesis Example 10 instead of the polyimide precursor varnish obtained in Synthesis Example 1, and baking them at 85° C. for 60 min.

In this example, the polyimide varnish obtained in Synthesis Example 9 or Synthesis Example 10 is used. The varnish has photosensitivity. Accordingly, in this example, there is no requirement for using the negative type rubber resist film 37 used in Example 1 for forming an aperture at a predetermined position of the prebaked film 36. Then, in this example, different from Example 1, a polyimide film 91 shown in FIG. 3E is obtained without coating of the negative type rubber resist, pattern formation and removing out, but only by exposure using a predetermined mask, development and rising and then baking at 140° C. for 60 min, at 200° C. for 60 min and at 350° C. for 60 min successively in a nitrogen gas stream.

Subsequently, when a second conductor layer 91 was formed in the same manner as in Example 1 to prepare a module substrate, cracking, chipping or peeling was not observed to the obtained module substrate and satisfactory electric conduction was obtained throughout the wirings as in Example 1.

Further, when the multichip module shown in FIG. 4 was prepared by using the module substrate obtained in this example by the same method as in Example 1, failure such as cracking, chipping or peeling was not observed and satisfactory electric conduction and operation characteristic were obtained throughout the wirings in the obtained multichip module.

[EXAMPLES 11 AND 12]

A prebaked film 36 shown in FIG. 3B was obtained in the same manner as in Example 1, as shown in FIG. 3A, by forming patterns of a chromium layer 33, a copper layer 34 and a chromium layer 35 successively on a substrate 31, coating a 1% solution of aluminum monoethyl acetate diisopropylate, applying heat treatment at 200° C. for 60 min, then spin-coating the polyimide precursor varnish obtained in Synthesis Example 1 in the same manner as in Example 1 in Example 11, and the polyimide precursor varnish obtained in Synthesis Example 5 instead of Synthesis Example 1 in Example 12, respectively, and baking them at 140° C. for 60 min.

Then, a polyimide film 91 shown in FIG. 3E was obtained by irradiating excimer laser (at 308 nm wavelength) to the obtained prebaked film 36 using a predetermined mask to exposure the underlying chromium 35, and then baking the prebaked film 36 at 200° C. for 60 min and at 350° C. for 60 min successively in a nitrogen gas stream. In Example 1, a through hole was formed at a predetermined position by etching the obtained prebaked film 36 by way of the resist layer 37, whereas the prebaked film was apertured by using the excimer layer in this example. In this example, different from Example 1, coating of the negative type rubber resist, pattern formation and removing are not necessary.

Subsequently, when a second conductor layer 91 was formed to manufacture a module substrate in the same manner as in Example 1, cracking, chipping or peeling was not observed in the obtained module substrate and satisfactory electric conduction was obtained throughout the wirings as in Example 1.

Further, when the multichip module shown in FIG. 4 was prepared by the same method as in Example 1 using the module substrate obtained in this example, failure such as cracking, chipping or peeling was not observed and satisfactory electric conduction and operation characteristic were obtained throughout the wirings in the obtained multichip module.

[EXAMPLE 13]

On a glass type ceramic substrate 31 (150 mm square, 4 mm thickness) having a copper wiring 32 in the inside, were formed a chromium layer 33 (film thickness: 0.07 μm), a copper layer 34 (film thickness: 5 μm) and a chromium layer 35 (film thickness: 0.05 μm) successively by RF sputtering. A resist was applied from above the metal layers 33 to 35 to the surface of the substrate 31 formed with the metal layers 33 to 35 by spin-coating and they were heated in a nitrogen atmosphere at 90° C. for 60 min. Then, after exposure by using a predetermined mask, development and rinsing, they were heated in a nitrogen atmosphere at 140° C. for 60 min and etched from the upper layer in a predetermined pattern in the order of the chromium layer 35, the copper layer 34 and the chromium layer 33. Then, the resist was stripped to obtain a first conductor layer 90 comprising three layers of chromium/copper/chromium in a predetermined pattern as shown in FIG. 3A.

Then, for increasing the adhesion strength on the surface of the metal layer, a 1% solution of aluminum monoethyl acetate diisopropylate was coated on the first conductor layer and the substrate surface and they were heat-treated at 200° C. for 60 min under air atmosphere. The polyimide precursor varnish synthesized in Synthesis Example 11 was applied by spin-coating to the first conductor layer and the substrate surface applied with the surface treatment and they were baked at 140° C. for 60 min to obtain a prebaked film 36 of the polyimide precursor as shown in FIG. 3B.

A negative type rubber resist 37 was applied by spin-coating to the surface of the prebaked film 36, and they were baked at 90° C. for 30 min with a hot plate, and after exposure by using a predetermined mask, development, rinsing, and baking at 140° C. for 60 min, ashing was applied for three minutes to obtain a resist layer 37 of a predetermined pattern as shown in FIG. 3C. Then, the substrate having the resist layer 37 was immersed in an aqueous solution of tetramethyl ammonium hydroxide (2.4% by weight) to etch the prebaked film 36 and expose the underlying chromium 35 as shown in FIG. 3D.

Then, after removing the resist 37 with a stripping solution, baking was applied at 140° C. for 60 min, at 200° C. for 60 min and at 350° C. for 60 min successively in a nitrogen gas stream to heat-cure the polyimide precursor of the prebaked film 36 to obtain a polyimide film 91 (film thickness: 8 μm) shown in FIG. 3E. The obtained polyimide film 91 contains a polyimide comprising repeating units represented by the following structural formula (24):

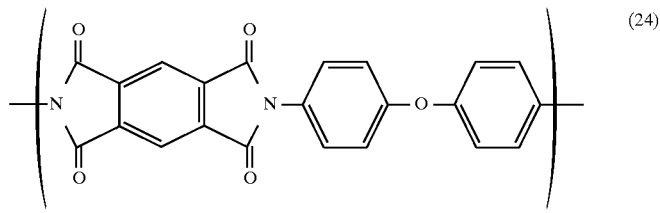

After sputtering the surface of the obtained polyimide film 91 by argon ions, a chromium layer 38 (film thickness: 0.05 μm) and a conductor layer 39 (film thickness: 2.0 μm) comprising a nickel-tungsten alloy comprising nickel as a main ingredient (Ni:W=93:7 (weight ratio) in this example) were formed successively by RF sputtering to obtain a second conductor layer 92 as shown in FIG. 9A. In this case, when the film stress of the conductor layer 39 was monitored on the silicon wafer, it was 400 MPa.

Then, a resist was applied by spin-coating to the surface of the conductor layer 39, and they were heated in a nitrogen atmosphere at 90° C. for 30 min with a hot plate, exposed by using a predetermined mask, developed, rinsed and then heated in a nitrogen atmosphere at 160° C. for 45 min to obtain a resist layer 37 of a predetermined pattern as shown in FIG. 9B. Subsequently, after ashing for three minutes, the conductor layer 39 and the chromium layer 38 were etched in this order to form the second conductor layer into a predetermined pattern as shown in FIG. 9C. In this case, an aqueous solution comprising phosphoric acid, nitric acid, acetic acid and ammonium fluoride was used for etching the conductor layer 39 and an aqueous solution of potassium permanganate was used for etching the chromium layer 38.

During etching of the second conductor layer 92, the first conductor layer was not eroded and etching fabrication of the second conductor layer 92 was conducted with no trouble.

The obtained polyimide film 91 contains a polyimide comprising repeating units represented by the following structural formula (5):

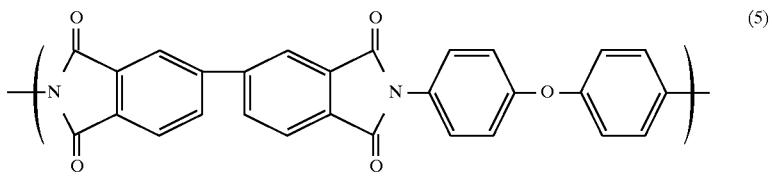

Figure 9D:
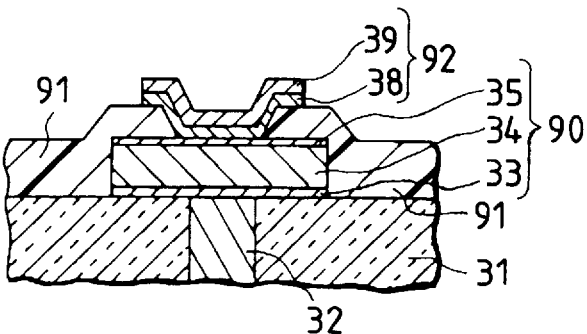

Then, when the resist was removed by a stripping solution, a surface electrode comprising the second conductor layer 92 was exposed to complete a module substrate shown in FIG. 9D. In the manufactured module substrate, cracking, chipping or peeling was not observed in any of the polyimide film in contact with the second conductor layer 92, the first conductor layer 90 and the ceramic substrate 31, and satisfactory electrical conduction was obtained throughout the wirings.

Further, as shown in FIG. 4, a first conductor layer 90, a polyimide layer 91 and a second conductor layer 92 were formed in the same manner as for the surface also to the remaining rear face of the substrate 31, kept in a hydrogen gas atmosphere at 350° C. for 30 min, and then gold plating was applied to the surface of the conductor layer 39 on both surface and rear face of the substrate 31 to form gold layers 40. For the gold layers 40, an input/output pin 42 was erected by way of solder 41 to the layer on the rear face, while an electrode 45 of LSI (Large Scale Integration) 44 was connected by way of solder 43 to the layer on the surface.

With the procedures as described above, a multichip module carrying thereon LSI 44 shown in FIG. 4 was completed. Failure such as cracking, chipping or peeling was not observed in the obtained multichip module and satisfactory electric conduction and satisfactory operation characteristic were obtained throughout the wirings.

[EXAMPLE 14]

A prebaked film 36 shown in FIG. 3B was obtained in the same manner as in Example 13 by forming patterns of a chromium layer 33, a copper layer 34 and a chromium layer 35 successively on a substrate 31 as shown in FIG. 3A, then coating a 1% solution of aluminum monoethyl acetate diisopropylate, applying a surface treatment by heat treatment at 200° C. for 60 min under air atmosphere, then spin-coating the polyimide precursor varnish obtained in Synthesis Example 14 instead of the polyimide precursor varnish obtained in Synthesis Example 11, and was baked at 85° C. for 60 min.

In this example, the polyimide precursor varnish obtained in Synthesis Example 14 was used. Since the varnish has photosensitivity, use of the negative type rubber resist film 37 used in Example 13 is not necessary for aperturing the prebaked film 36 at a predetermined position. Then, in this example, different from Example 13, the polyimide film 91 (film thickness: 8 μm) shown in FIG. 3E was obtained without coating of the negative type rubber resist, pattern formation and removing, but merely by applying exposure by using a predetermined mask, development and rising and then baking at 140° C. for 60 min, at 200° C. for 60 min and at 350° C. for 60 min successively in a nitrogen gas stream.

Subsequently, when the second conductor layer 91 was formed in the same manner as in Example 13, to manufacture a module substrate, cracking, chipping or peeling was not observed, and satisfactory electric conduction was obtained throughout the wirings in the obtained module substrate as in Example 13.

Further, when the multichip module shown in FIG. 4 was prepared by the same method as in Example 13 by using the module substrate obtained in this example, failure such as cracking, chipping or peeling was not observed, and satisfactory electric condition and satisfactory operation characteristic were obtained throughout the wirings in the obtained multichip module.

[Comparative Examples 1 to 3]

A first conductor layer 90, a polyimide layer 91, a second conductor layer 92 and a resist layer 37 of predetermined patterns were formed on the surface of a glass type ceramic substrate 31 by using the polyimide precursor varnishes prepared in Synthesis Examples 11 to 13 instead of the polyimide precursor varnish prepared in Synthesis Example 1, as shown in FIG. 9C in the same method as in Example 1. The method of forming the conductor layer in this comparative examples is a DC method like that in Example 1 providing large film stress, different from the RF method in Example 13.

Then, when the resist was removed by a stripping solution to expose the second conductor layer as shown in FIG. 9D, it was confirmed that cracking occurred in the polyimide layer 91 at a portion in contact with the end of the chromium layer 38 and at a portion in contact with the end of the chromium layer 35.

Then, when a first conductor layer 90, a polyimide layer 91 and a second conductor layer 92 were formed in the same manner as in Example 1 also on the rear face of the substrate 31, cracking was formed as for the surface. Further, when they were kept in a hydrogen gas atmosphere at the 350° C. for 30 min, a portion of the second conductor layer 92 was peeled. After all, the module substrate could not be completed by using any of the varnishes prepared in Synthesis Examples 11 to 13.

[Comparative Example 4]

FIG. 5 shows a manufacturing process for the metalization structure of this comparative example.

Figure 5A:
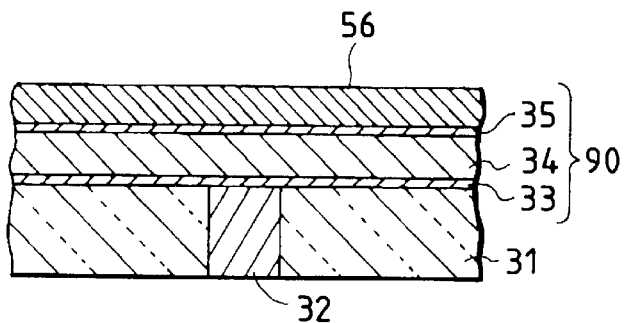
FIG. 5 is a schematic view illustrating a manufacturing method for a metalization structure of the prior art.

At first, as shown in FIG. 5A, on a glass type ceramic substrate 31 (150 mm square, 4 mm thickness) having a copper wiring 32 in the inside, were formed a first conductor layer 90 (chromium layer 33 (film thickness: 0.07 μm), copper layer 34 (film thickness: 5 μm) and a chromium layer 35 (film thickness: 0.05 μm)), and a conductor layer 56 comprising nickel as a main ingredient (film thickness: 2.0 μm) as a second conductor layer successively by DC sputtering.

Figure 5B:
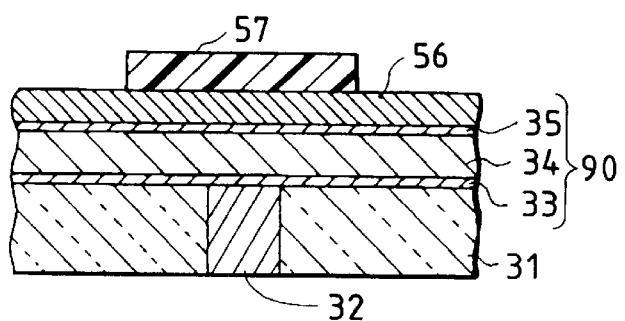

After spin-coating a resist on the surface of the obtained second conductor layer 56 and heating in a nitrogen atmosphere at 90° C. for 45 min, it was exposed by using a predetermined mask, developed and rinsed and then heated in a nitrogen atmosphere at 140° C. for 60 min to obtain a resist layer 57 of a predetermined pattern as shown in FIG. 5B.

Figure 5C:
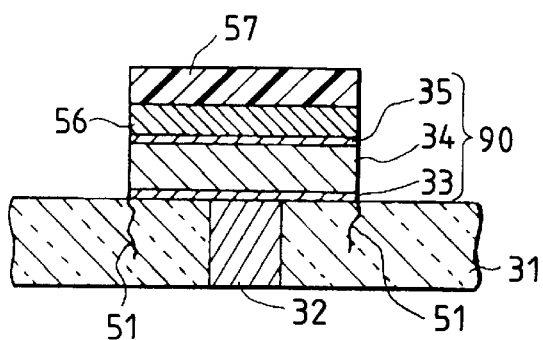
Figure 6:
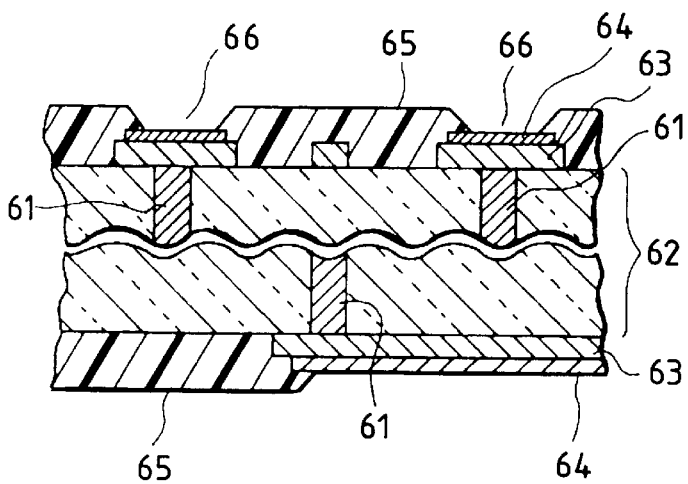
FIG. 6 is a fragmentary cross sectional view for a metalization structure of the prior art.

Then, when the second conductor layer 56, the chromium layer 35, the copper layer 34 and the chromium layer 33 were etched in this order, and the second conductor layer 56 and the first conductor layer 90 were fabricated into predetermined patterns, it was confirmed that cracking 51 was formed to the underlying ceramic substrate 51 as shown in FIG. 5C.

Further, after stripping the resist layer 57, when heating was applied for drying at 140° C. for 45 min and at 200° C. for 60 min, it was observed that the patterns of the second conductor layer 56 and the first conductor layer 90 were peeled at a number of locations from the substrate 31. After all, the aimed module substrate could not be completed in this example.

[Effect of Each of Examples 1 to 14]

As can be seen from Examples 13 and 14, when the end of the second conductor layer 92 and the first conductor layer 90 are kept from direct contact with each other, but are bonded by way of the polyimide layer 91, it is possible to prevent the cracking in the underlying layer for the first conductor layer 90 and the peeling of the conductor layer occurring in Comparative Example 4.

This is because the stresses concentrated to the ends of the first conductor 90 formed on the underlying layer and the second conductor layer 92 are not added but dispersed since the polyimide layer 91 is present between the ends of the conductor layers 91 and 92. On the other hand, in the case of Comparative Example 4, since the ends of the conductor layers 90 and 92 are in contact with each other, the stresses are joined to cause cracking or peeling.

Further, while cracking may be formed to the polyimide layer 92 as in Comparative Examples 1 to 3, this can be prevented by using a polyimide of small film stress (low thermal expansion) used in the present invention as can be seen from Examples 1 to 12. This is because the polyimide itself in each of the examples generates small stress, has large tensile strength and excellent adhesion to the metal of the metal layer formed on the upper layer such as chromium.

Furthermore, although cracking occurs in the polyimide film in Comparative Example 1, no cracking is formed in Example 13 using the same polyimide precursor varnish. It can be seen from the above that formation of cracking can be prevented even by using a polyimide having large thermal expansion coefficient only if the conductor layer is formed by a method capable of obtaining a film of small film stress.

According to the present invention, neither the conductor portion peels from the substrate nor cracking occurs to the underlying layer during manufacturing of the metalization structure. Therefore, according to the present invention, a metalization structure of high reliability can be obtained stably.

What is claimed is:

1. A metalization structure comprising a conductor layer and a insulative film containing a polyimide and, further, a conductor layer of a conductor material on the surface of the insulative film, said polyimide being obtained by polymerizing:

a tetracarboxylic acid dianhydride represented by the following general formula (15):

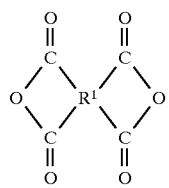

(15)

where R1 represents at least one tetravalent organic group selected from the following structural formula (2):

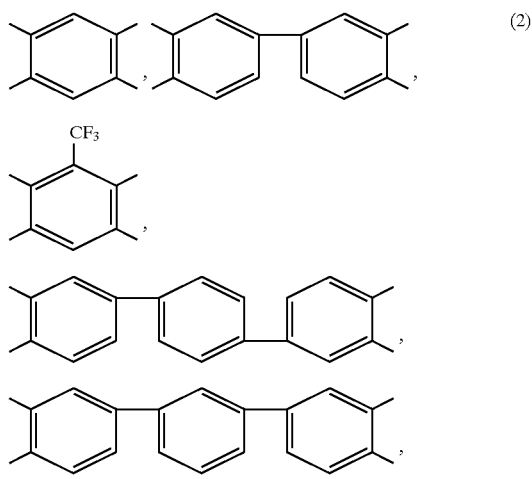

(2)

and a diamine compound represented by the following general formula (16):

$$H_2N-R^2-NH_2 \quad (16)$$

where R2 is at least one bivalent organic group selected from the following structural formulae (3):

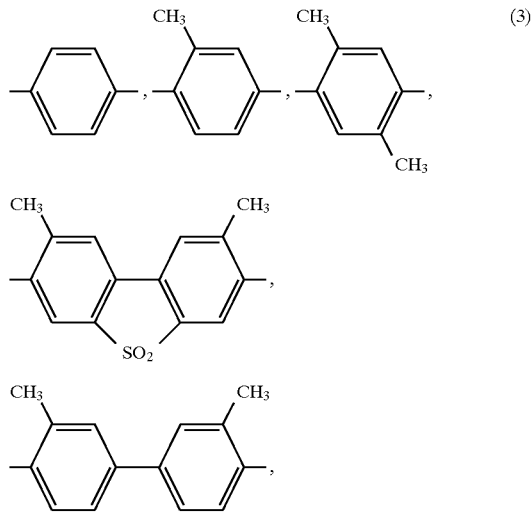

(3)

-continued

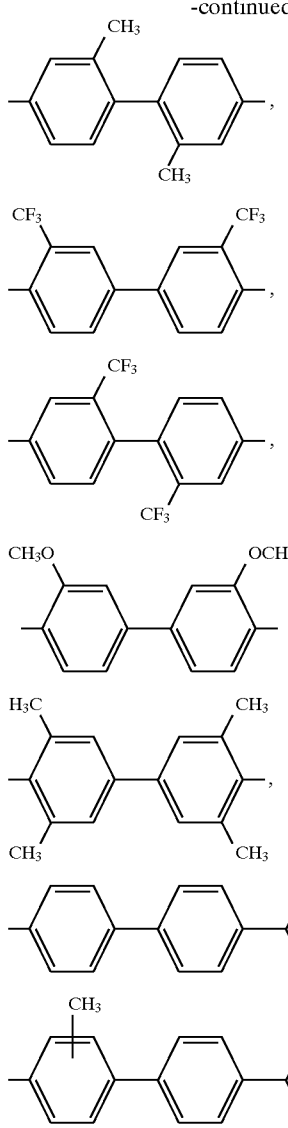

2. A metalization structure as defined in claim 1, wherein the polyimide is obtained by polymerizing:

a tetracarboxylic acid dianhydride represented by the following general formula (21):

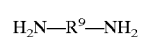 (21)

where R7 is at least one tetravalent organic group selected from the following structural formulae (12):

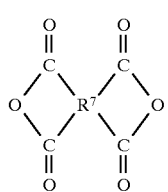 (12)

-continued

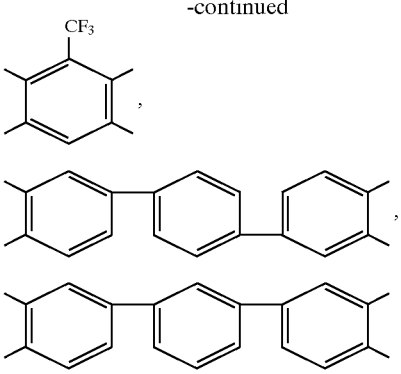

and a diamine compound represented by the following general formula (23):

$$H_2N-R^9-NH_2 \quad (23)$$

where R9 is at least one bivalent organic group selected from the following structural formulae (14):

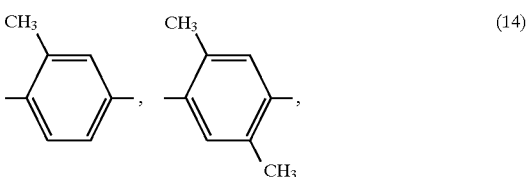 (14)

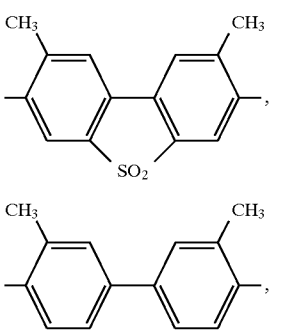

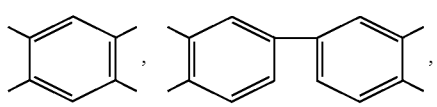

3. A metalization structure as defined in claim 1, wherein the polyimide is obtained by polymerizing:

a tetracarboxylic acid dianhydride represented by the following general formula (21):

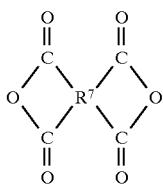
(21)

where R7 is at least one tetravalent organic group selected from the following structural formulae (12):

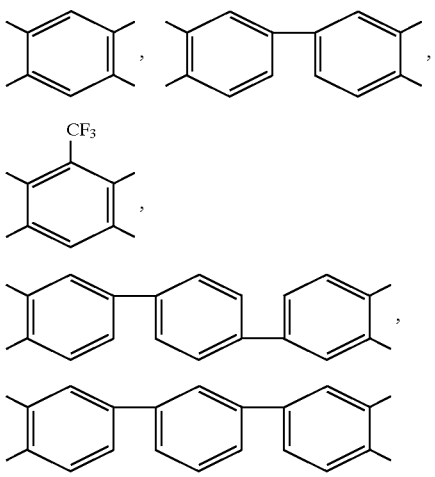
(12)

and a diamine compound including:
based on 100 mol of the entire amount,
0 to 95 (excluding 0) mol of a diamine compound represented by the following general formula (22):

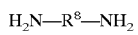
(22)

where R8 is at least one bivalent organic group selected from the following structural formulae (13):

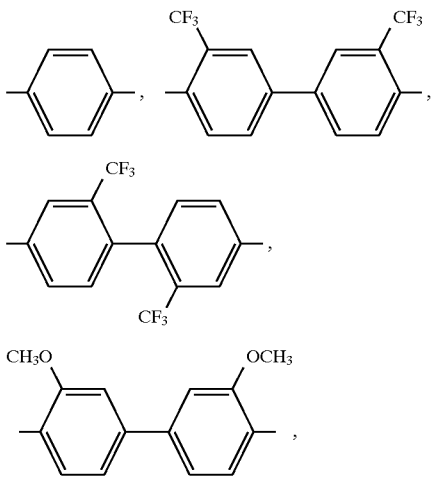
(13)

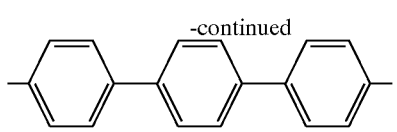

and 5 to 100 mol of a diamine compound represented by the following general formula (23):

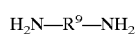
(23)

where R9 is at least one bivalent organic group selected from the following structural formulae (14):

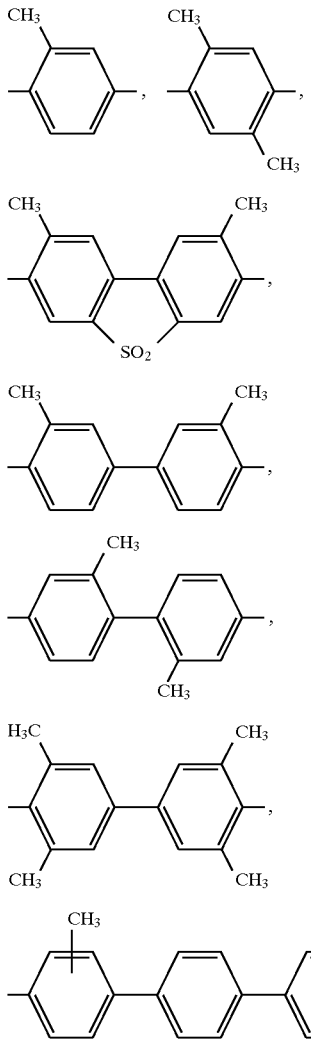
(14)

4. A metalization structure comprising an insulative film contained a polyimide and, further, comprising a conductor layer of a conductor material on the surface of the insulative film, said polyimide being obtained by polymerizing:
based on 100 mol of the entire amount of the tetracarboxylic acid dianhydride,
60 to 100 ml of a tetracarboxylic acid dianhydride represented by the following general formula (17):

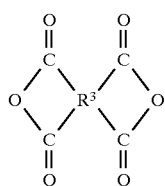

where R3 represents at least one tetravalent organic group selected from the following structural formulae (6):

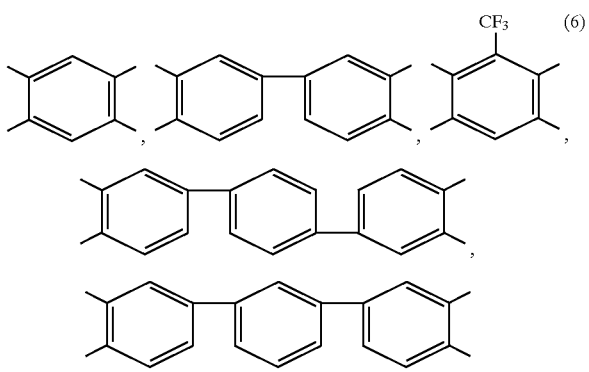

0 to 40 (excluding 0) mol of a tetracarboxylic acid dianyydride represented by the following general formula (18):

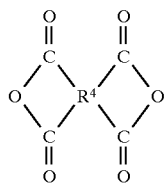

where R4 is at least one tetravalent organic group selected from the following structural formulae (7):

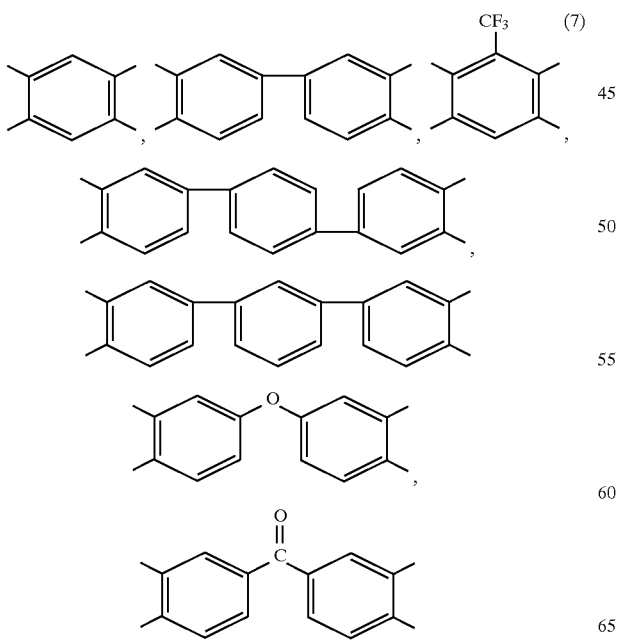

60 to 100 mol of a diamine compound represented by the following general formula (19):

$$H_2N-R^5-NH_2 \qquad (19)$$

where R5 is at least one bivalent organic group selected from the following structural formulae (8):

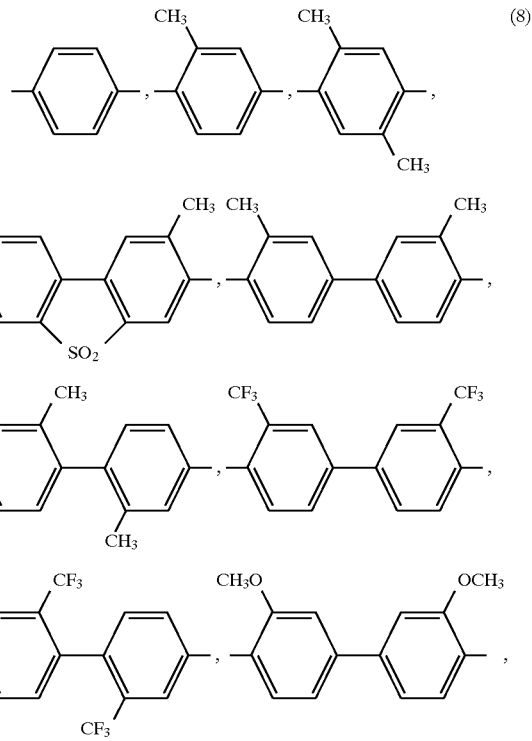

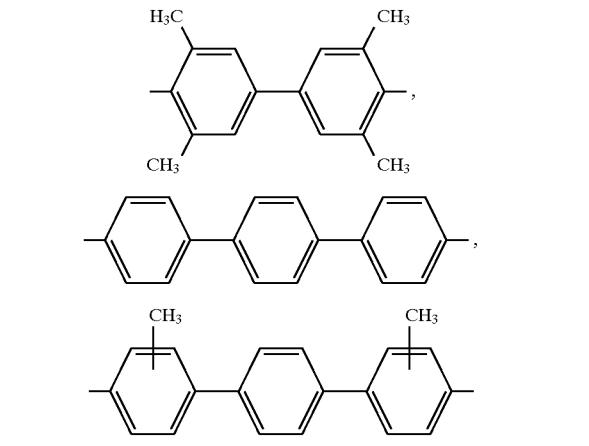

and 0 to 40 (excluding 0) mol of a diamine compound represented by the following general formula (20):

$$H_2N-R^6-NH_2 \qquad (20)$$

where R6 is at least one bivalent organic group selected from the following structural formulae (9):

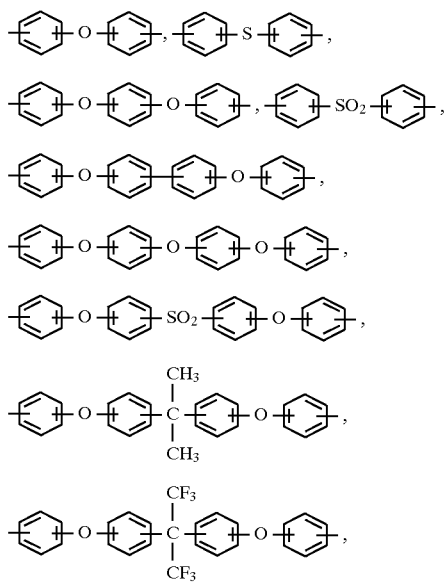

(9)

5. A metalization structure as defined in claim 1 or 4, wherein the conductor layer at least has a layer c omprising a conductor material containing nickel.

6. A metalization structure as defined in claim 5, wherein the conductor layer has a layer comprising chromium, titanium, molybdenum or tungsten, and a layer comprising a conductor material containing nickel.

7. A metalization structure as defined in claim 1 or 4, wherein the thickness of the conductor layer is not more than 3.0 μm.

8. A metalization structure as defined in claim 6, wherein the thickness of the layer comprising the conductor material containing nickel is not more than 3.0 μm.

9. A metalization structure comprising a first conductor layer on a surface of an underlying and, further, a second conductor layer connected conductively with the first conductor layer, a structure in which a polyimide insulative film is present between at least an end of the second conductor layer pattern and the first conductor layer being provided to at least a portion thereof.

10. A metalization structure as defined in claim 9, wherein a portion of the second conductor layer is in direct formation with the surface of the first conductor layer.

11. A metalization structure as defined in claim 9, wherein the first conductor layer and the second conductor layer are connected by way of a third conductor layer.

12. A metalization structure as defined in claim 9,
wherein the first conductor layer at least has a layer comprising a first conductor material containing copper, and
the second conductor layer at least has a layer comprising a second conductor material containing nickel.

13. A metalization structure as defined in claim 12, wherein the first conductor layer has:
a layer comprising chromium, titanium, molybdenum or tungsten;
a layer comprising the first conductor material; and
a layer comprising chromium, titanium, molybdenum or tungsten, in this order.

14. A metalization structure as defined in claim 12, wherein the second conductor layer has a layer comprising chromium, titanium, molybdenum or tungsten, and a layer comprising the second conductor material.

15. A metalization structure as defined in claim 11, wherein the third conductor layer is a layer comprising a conductor material containing copper.

16. A metalization structure as defined in claim 9, wherein the thickness of the second conductor layer is not more than 3.0 μm.

17. A metalization structure as defined in claim 14, wherein the thickness of the layer comprising the second conductor material is not more than 3.0 μm.

18. A metalization structure as defined in claim 9, wherein the polyimide insulative film contains a polyimide obtained by polymerizing:
a tetracarboxylic acid dianhydride represented by the following general formula (15):

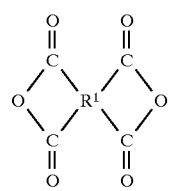

(15)

where R1 is at least one tetravalent organic group selected from the following structural formulae (2):

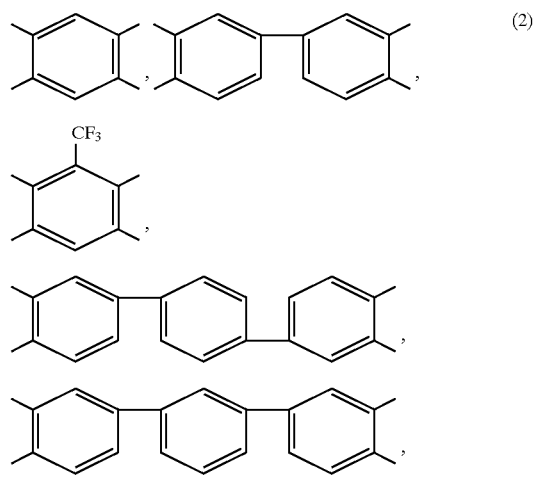

(2)

and a diamine compound represented by the following general formula (16):

$H_2N-R^2-NH_2$ (16)

where R2 is at least bivalent organic group selected from the following structural formulae (3):

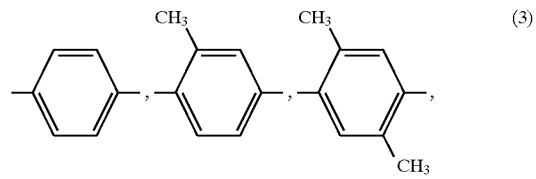

(3)

-continued

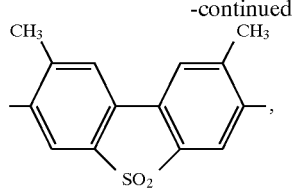

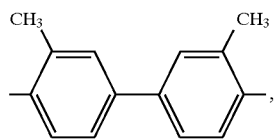

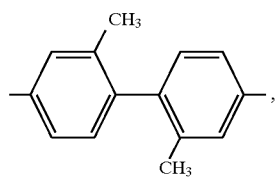

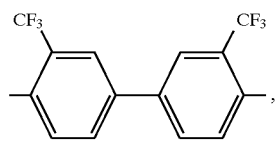

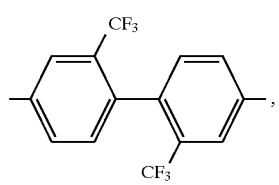

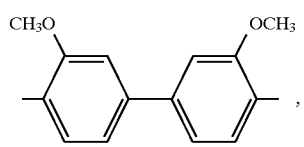

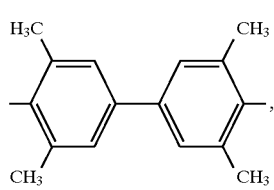

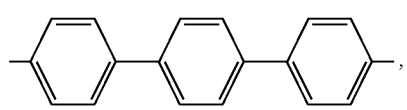

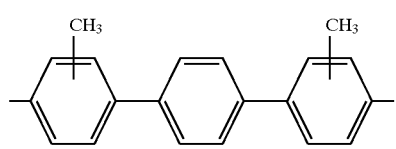

19. A metalization structure as defined in claim 18, wherein the polyimide is obtained by polymerizing:

a tetracarboxylic acid dianhydride represented by the following general formula (21):

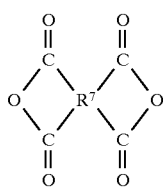 (21)

where R7 is at least one tetravalent organic group selected from the following structural formulae (12):

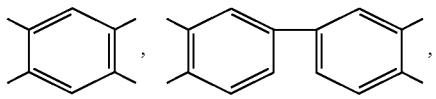 (12)

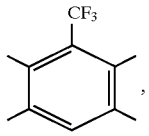

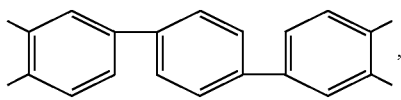

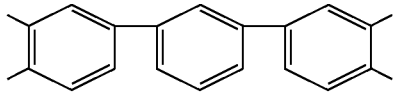

and a diamine compound represented by the following general formula (23):

$$H_2N-R^9-NH_2 \quad (23)$$

where R9 is at least one bivalent organic group selected from the following structural formulae (14):

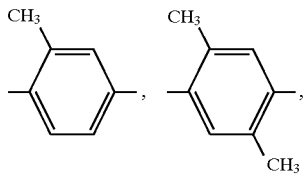 (14)

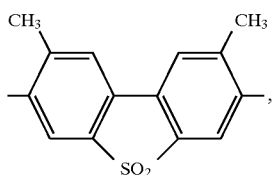

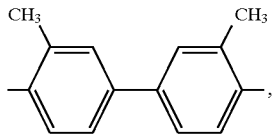

-continued

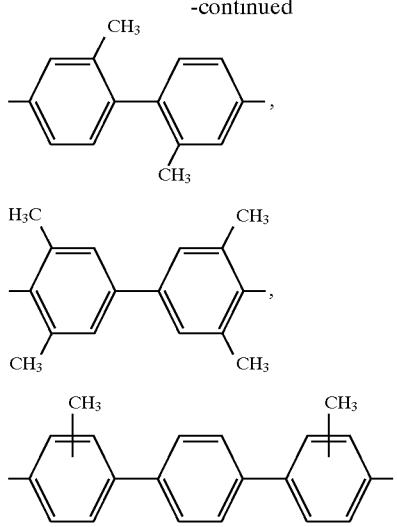

20. A metalization structure as defined in claim 18, wherein the polyimide is obtained by polymerizing:

a tetracarboxylic acid dianhydride represented by the general formula (21):

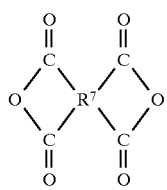 (21)

where R7 is at least one tetravalent organic group selected from the following structural formulae (12):

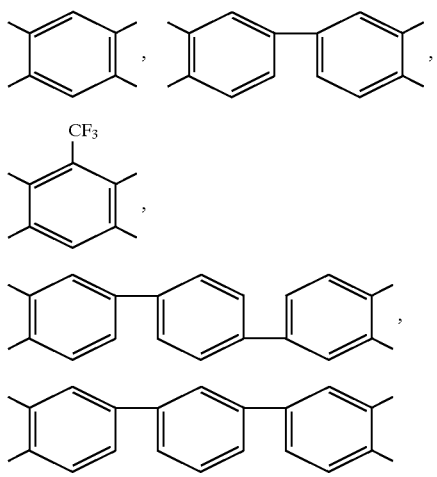 (12)

and
a diamine compound including:
based on 100 mol of the entire amount of the diamine compound,
0 to 95 mol of a diamine compound represented by the following general formula (22):

$H_2N-R^8-NH_2$ (22)

where R8 is at least one bivalent organic group selected from the following structural formulae (13):

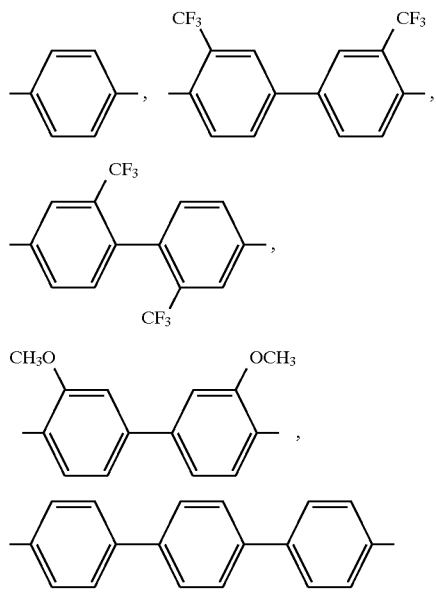 (13)

and 5 to 100 mol of a diamine compound represented by the following general formula (23):

$H_2N-R^9-NH_2$ (23)

where R9 is at least one bivalent organic group selected from the following structural formulae (14):

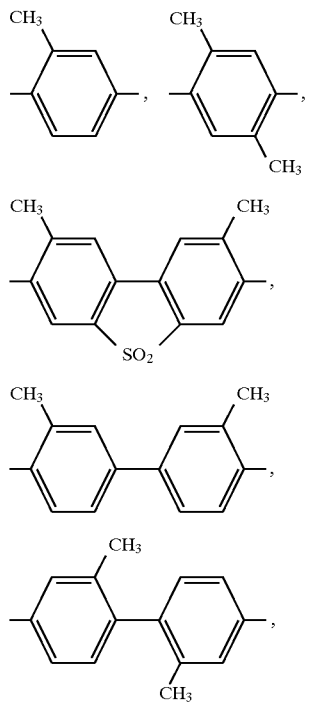 (14)

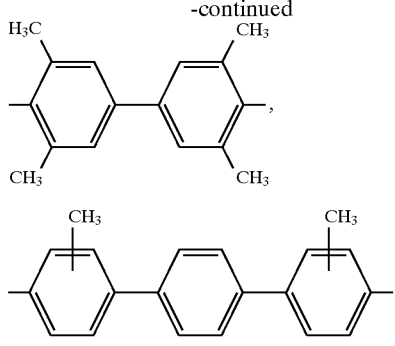

21. A metalization structure as defined in claim 9, wherein the polyimide insulative film contains a polyimide obtained by polymerizing:

based on 100 mol of the entire amount of the tetracarboxylic acid dianhydride, 60 to 100 mol of a tetracarboxylic acid dianhydride represented by the following general formula (17):

$$\underset{O}{\overset{O}{\underset{\|}{C}}}\underset{\overset{\|}{O}}{\overset{O}{\underset{\|}{C}}}R^3\underset{\overset{\|}{O}}{\overset{O}{\underset{\|}{C}}}\underset{\overset{\|}{O}}{\overset{O}{\underset{\|}{C}}} \qquad (17)$$

where R3 is at least one tetravalent organic group selected from the following structural formulae (6):

(6)

0 to 40 (excluding 0) mol of a tetracarboxylic acid dianhydride represented by the following general formula (18):

(18)

where R4 is at least one tetravalent organic group selected from the following structural formula (7):

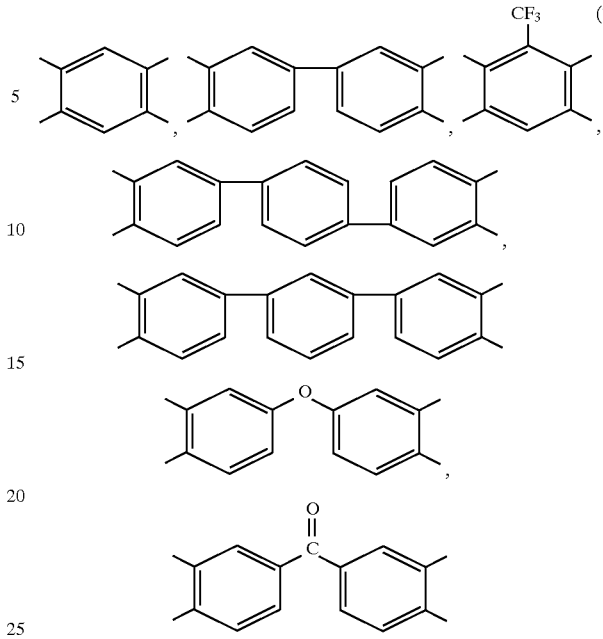

(7)

60 to 100 mol of a diamine compound represented by the following general formula (19):

$$H_2N\text{—}R^5\text{—}NH_2 \qquad (19)$$

where R5 is at least one bivalent organic group selected from the following structural formulae (8):

(8)

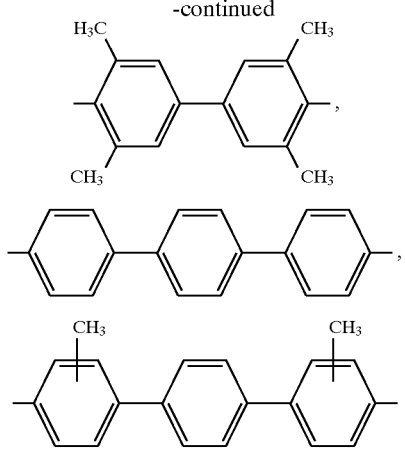

and 0 to 40 (excluding 0) mol of a diamine compound represented by the following general formula (20):

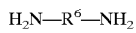 (20)

where R6 is at least one bivalent organic group selected from the following structural formulae (9):

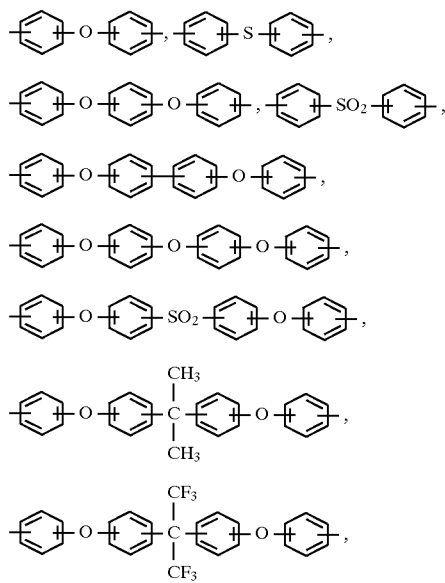

22. A method of manufacturing a metalization structure comprising:
   a first conductor layer forming step of forming a conductor pattern of a first conductor layer on the surface of an underlying layer;
   an insulative film forming step of forming a polyimide insulative film having through holes at positions for exposing at least a portion of the conductor pattern of the first conductor layer, on the surface of the underlying layer provided with the first conductor layer; and
   a second conductor forming step of forming a conductor pattern of a second conductor layer so as to cover the exposed conductor pattern of the first conductor layer and the periphnery for the opening of the through holes of the polyimide insulative film.

23. A method of manufacturing a metalization structure comprising:
   a first conductor layer forming step of forming a conductor pattern of a first conductor layer on the surface of an underlying layer;
   an insulative film forming step of forming a polyimide insulative film having through holes at positions for exposing at least a portion of the conductor pattern of the first conductor layer, on the surface of the underlying layer provided with the first conductor layer;
   a via wiring forming step of forming via wirings by filling a conductor to the through holes; and
   a second conductor layer forming step of forming a conductor pattern of a second conductor layer so as to cover the exposed surface of the conductor constituting the via wirings filled to the conductor and the periphery of the exposed surface.

24. A method of manufacturing a metalization structure as defined in claim 22 or 23,
   wherein the first conductor layer forming step has at least a step of forming a layer comprising a first conductor material containing copper, and
   the second conductor layer forming step has at least a step of forming a layer comprising a second conductor material containing nickel.

25. A method of manufacturing a metalization structure as defined in claim 24, wherein the first conductor layer forming step comprises:
   a step of forming a layer comprising chromium, titanium, molybdenum or tungsten;
   a step of forming a layer comprising the first conductor material; and
   a step of forming a layer comprising chromium, titanium, molybdenum or tungsten, in this order.

26. A method of manufacturing a metalization structure as defined in claim 24, wherein the second conductor layer forming step comprises:
   a step of forming a layer comprising chromium, titanium, molybdenum or tungsten; and
   a step of forming a layer comprising the second conductor material.

27. A method of manufacturing a metalization structure as defined in claim 23, wherein the conductor material filled in the through hole in the via wiring forming step contains copper.

28. A method of manufacturing a metalization structure as defined in claim 22 or 23, wherein the thickness of the second conductor layer formed in the second conductor layer forming step is not more than 3.0 $\mu$m.

29. A method of manufacturing a metalization structure as defined in claim 26, wherein the thickness of the second conductor layer formed in the second conductor layer forming step is not more than 3.0 $\mu$m.

30. A method of manufacturing a metalization structure as defined in claim 22 or 23, wherein the insulative film forming step includes a step of obtaining a polyimide by heat-curing a polyimide precursor obtained by polymerizing:
   a tetracarboxylic acid dianhydride represented by the following general formula (15):

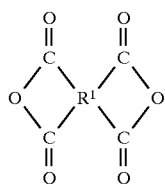

(15)

where R1 represents at least one tetravalent organic group selected from the following structural formula:

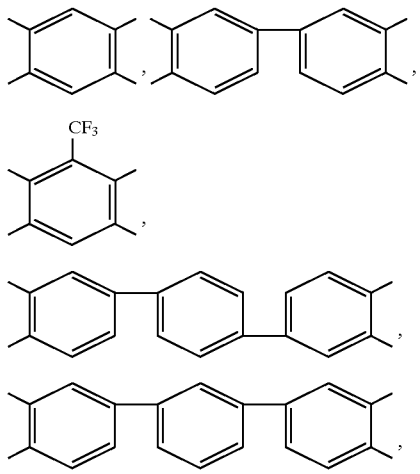

(2)

and a diamine compound represented by the following general formula (16):

$H_2N-R^2-NH_2$ (16)

where R2 is at least one bivalent organic group selected from the following structural formulae (3):

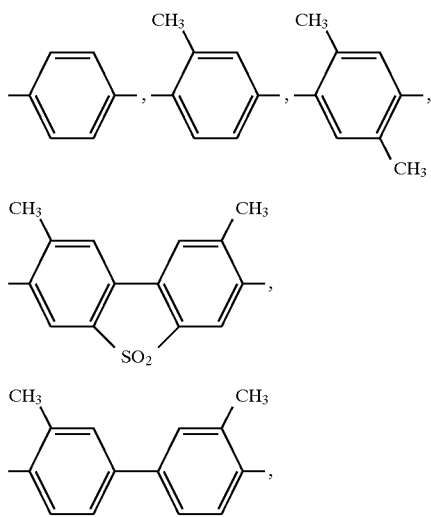

(3)

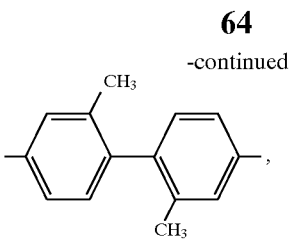

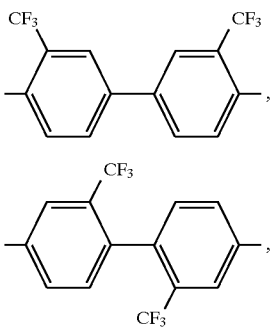

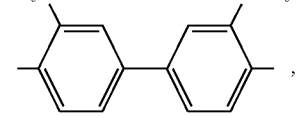

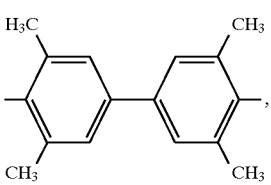

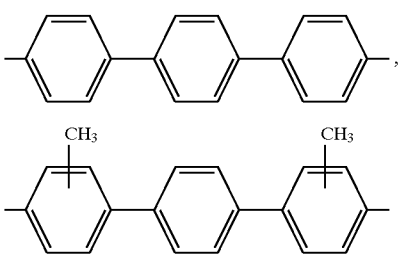

31. A method of manufacturing a metalization structure as defined in claim 30, wherein the step of obtaining the polyimide is a step of heat-curing a polyimide precursor obtained by polymerizing:

a tetracarboxylic acid dianhydride represented by the following general formula (21):

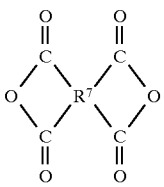

(21)

where R7 is at least one tetravalent organic group selected from the following structural formulae (12):

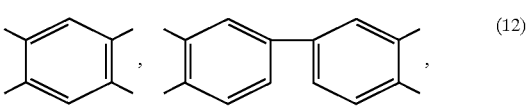

(12)

-continued

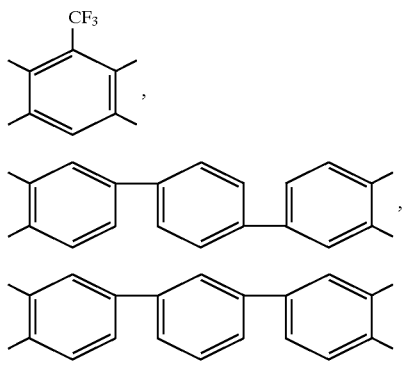

and a diamine compound represented by the following general formula (23):

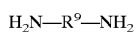 (23)

where R9 is at least one bivalent organic group selected from the following structural formulae (14):

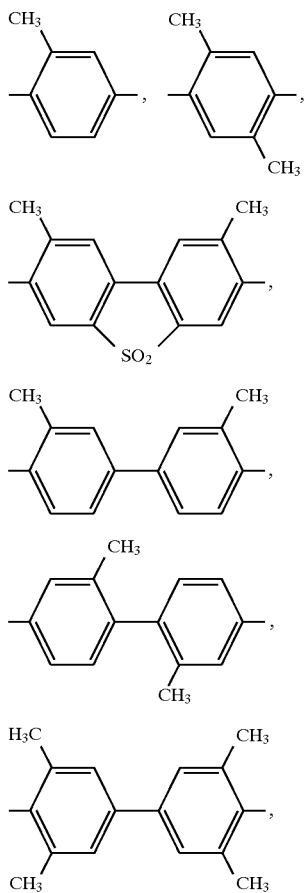 (14)

-continued

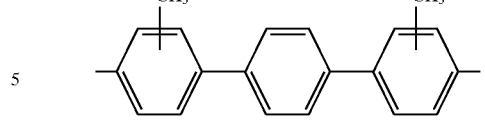

32. A method of manufacturing a metalization structure as defined in claim 30, wherein the step of obtaining the polyimide is a step of heat-curing a polyimide precursor obtained in polymerizing:

a tetracarboxylic acid dianhydride represented by the following general formula (21):

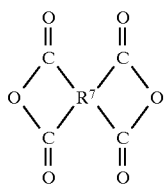 (21)

where R7 is at least one tetravalent organic group selected from the following structural formulae (12):

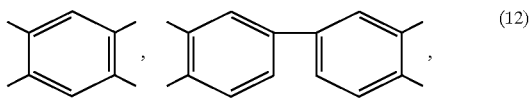 (12)

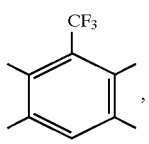

and a diamine compound including:

based on 100 mol of the entire amount, 0 to 95 (excluding 0) mol of a diamine compound represented by the following general formula (22):

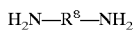 (22)

where R8 is at least one bivalent organic group selected from the following structural formulae (13):

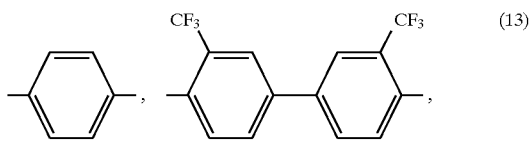 (13)

-continued

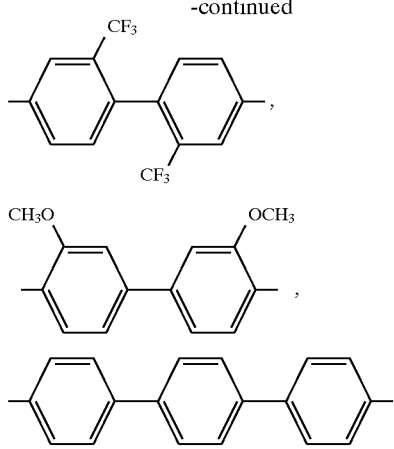

and 5 to 100 mol of a diamine compound represented by the following general formula (23):

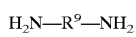 (23)

where R9 is at least one bivalent organic group selected from the following structural formulae (14):

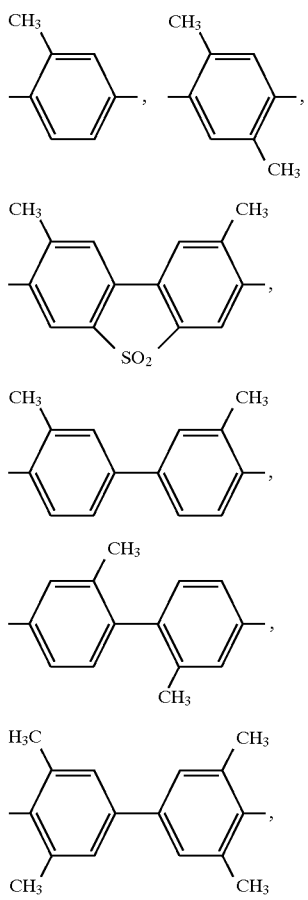

-continued

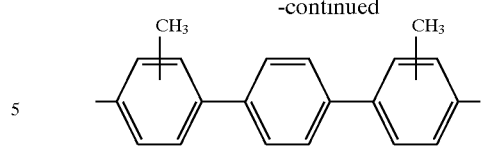

33. A method of manufacturing a metalization structural as defined in claim 22 or 23, wherein the insulative film forming step contains a step of heat-curing a polyimide precursor obtained by polymerizing:

based on the entire amount of 100 mol of the tetracarboxylic acid dianhydride, 60 to 100 mol, of a tetracarboxylic acid dianhydride represented by the following general formula (17):

 (17)

where R3 represents at least one tetravalent organic group selected from the following structural formula (6):

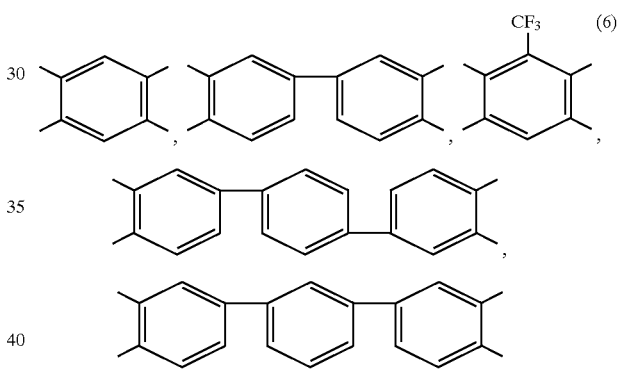 (6)

0 to 40 (excluding 0) mol of a tetracarboxylic acid dianhydride represented by the following general formula (18):

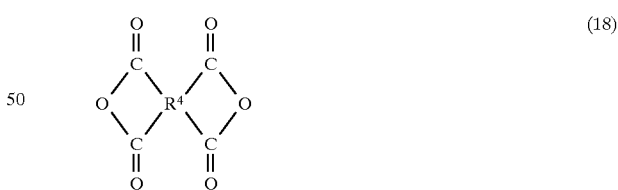 (18)

where R4 is at least one tetravalent organic group selected from the following structural formulae (7):

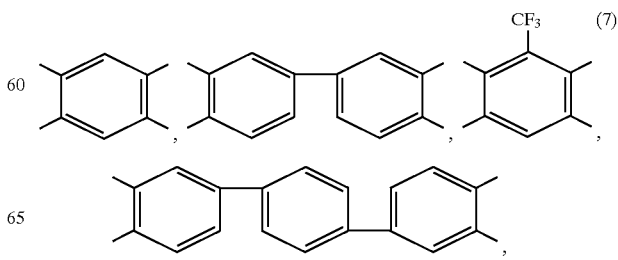 (7)

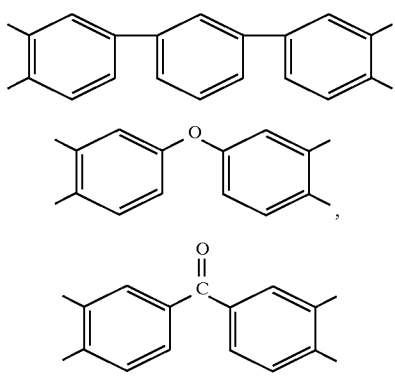

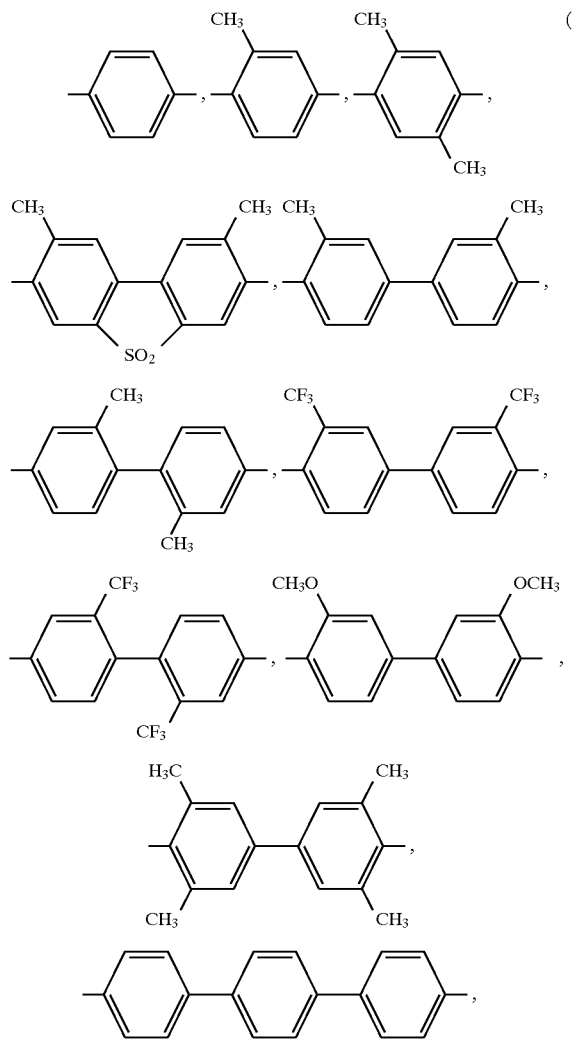

60 to 100 mol of a diamine compound represented by the following general formula (19):

$$H_2N-R^5-NH_2 \quad (19)$$

where R5 is at least one bivalent organic group selected from the following structural formulae (8):

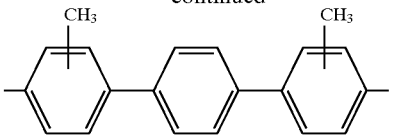

and 0 to 40 (excluding 0) mol of a diamine compound represented by the following general formula (20):

$$H_2N-R^6-NH_2 \quad (20)$$

where R6 is at least one bivalent organic group selected from the following structural formulae (9):

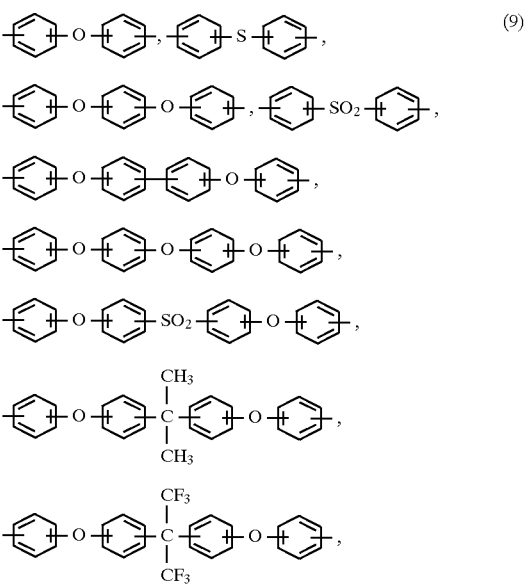

34. A method of manufacturing a metalization structure as defined in claim 22 or 23, wherein the insulative film forming step comprises:

a varnish coating step of coating a polyimide precursor varnish on the surface of the underlying layer having the first conductor layer and then applying prebaking to form a polyimide precursor layer;

a through hole forming step of forming through holes to locations of the polyimide precursor to expose at least a portion of the first conductor layer pattern; and a polymerization step of heat-curing the polyimide precursor layer, in this order.

35. A method of manufacturing a metalization structure as defined in claim 34, wherein the polyimide precursor varnish coated in the varhish coating step contains a photosensitive ingredient, and the through hole forming step includes a step of irradiating light to the polyimide precursor composition film by way of a photomask of a predetermined pattern and then applying development.

36. A method of manufacturing a metalization structure as defined in claim 22 or 23, wherein the second conductor layer forming step includes a step of forming the conductor layer by plating or RF sputtering.

* * * * *